United States Patent
Nagata et al.

(10) Patent No.: US 7,548,403 B2
(45) Date of Patent: Jun. 16, 2009

(54) OVERCURRENT DETECTION CIRCUIT

(75) Inventors: Junichi Nagata, Nukata-gun (JP);
Masayuki Kominami, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/654,541

(22) Filed: Jan. 18, 2007

(65) Prior Publication Data

US 2007/0171590 A1    Jul. 26, 2007

(30) Foreign Application Priority Data

Jan. 20, 2006 (JP) .............................. 2006-012138
Jan. 20, 2006 (JP) .............................. 2006-012139

(51) Int. Cl.
*H02H 3/08*    (2006.01)
(52) U.S. Cl. .................................... 361/93.1
(58) Field of Classification Search ................. 361/93.1
See application file for complete search history.

(56) References Cited

U.S. PATENT DOCUMENTS

| | | | | |
|---|---|---|---|---|
| 4,412,186 | A * | 10/1983 | Nagano | 330/288 |
| 4,492,929 | A * | 1/1985 | Vyne | 330/253 |
| 5,214,316 | A * | 5/1993 | Nagai | 327/143 |
| 5,422,593 | A | 6/1995 | Fujihira | |
| 5,999,041 | A | 12/1999 | Nagata et al. | |
| 6,011,413 | A * | 1/2000 | Hayakawa et al. | 327/51 |
| 6,269,011 | B1 * | 7/2001 | Ohshima | 363/50 |
| 2005/0225389 | A1 | 10/2005 | Koyasu | |
| 2005/0231406 | A1 * | 10/2005 | Flasck et al. | 341/124 |

FOREIGN PATENT DOCUMENTS

| | | |
|---|---|---|
| JP | A-03-262209 | 11/1991 |
| JP | A-11-083911 | 3/1999 |
| JP | A-2003-045696 | 2/2003 |

OTHER PUBLICATIONS

Horowitiz, Paul and Hill, Winfield ; The Art of Electronics: Second Edition: Cambridge University Press, 1989.*
Office Action dated Aug. 19, 2008 in corresponding German patent application No. 10 2007 002 334.2-31 (and English translation).

* cited by examiner

*Primary Examiner*—Stephen W Jackson
*Assistant Examiner*—Nicholas Ieva
(74) *Attorney, Agent, or Firm*—Posz Law Group, PLC

(57) ABSTRACT

An overcurrent detection circuit for detecting an overcurrent condition in an output transistor connected in series with an electrical load includes a pair of transistors having input terminals connected together. The pair of transistors is interposed between a current mirror circuit and a resistor and between the current mirror circuit and a detection transistor capable of being turned on at the same time as the output transistor. When a voltage is applied to the input terminals of the pair of the transistors, output terminals of the current mirror circuit are fixed at the same potential. Thus, even when an early effect occurs in the current mirror circuit, an electric current flowing through the resistor becomes equal to that flowing through the detection transistor. The overcurrent detection circuit can accurately detect the overcurrent condition based on a voltage drop across the resistor.

12 Claims, 19 Drawing Sheets

OVERCURRENT DETECTION CIRCUIT

CROSS REFERENCE TO RELATED APPLICATION

This application is based on and incorporates herein by reference Japanese Patent Application No. 2006-12138 filed on Jan. 20, 2006 and No. 2006-12139 filed on Jan. 20, 2006.

FIELD OF THE INVENTION

The present invention relates to an overcurrent detection circuit for detecting an overcurrrent condition in an output transistor connected in series with an electrical load.

BACKGROUND OF THE INVENTION

FIG. 22 shows a conventional overcurrent detection circuit 12 disclosed in, for example, U.S. Pat. No. 6,011,413 corresponding to JP-3680513. The overcurrent detection circuit 12 detects an overcurrent (i.e., excessive current) condition in an N-channel metal oxide semiconductor (MOS) transistor 2 that is connected in series with an electrical load 1 to drive the load 1 by a load current IL. For example, the load 1 is a solenoid, a lamp, or a DC motor of a vehicle. The series circuit of the load 1 and the MOS transistor 2 is connected between a power supply voltage VB and a first ground PGND. Each of the MOS transistor 2 and another N-channel MOS transistor 3 has a source connected to the first ground PGND and a gate connected to an output of a driver circuit 4. Thus, the MOS transistors 2, 3 are turned on/off at the same time by a gate signal IN applied to an input of the driver circuit 4.

The MOS transistor 2 has a drain connected to a non-inverting input of an operational amplifier (op-amp) 5 and the MOS transistor 3 has a drain connected to an inverting input of the op-amp 5. An output of the op-amp 5 is connected to a terminal a of a current mirror circuit 6. The current mirror circuit 6 includes three PNP transistors 7-9. Each of the transistors 7, 8 has an emitter connected to the output of the op-amp 5 and has a base connected to an emitter of the transistor 9. The transistor 9 has a base connected to a collector of the transistor 8 and a collector connected to a second ground GND.

The transistor 7 has a collector (i.e., a terminal c of the current mirror circuit 6) connected to the second ground GND via a resistor 10 for detecting a collector current I1 of the transistor 7. The collector (i.e., a terminal b of the current mirror circuit 6) of the transistor 8 is connected to the drain of the MOS transistor 3. The collector of the transistor 7 is connected to an input of a voltage sensor 11. A size ratio of the MOS transistor 2 to the MOS transistor 3 is set to N to 1, where N is a positive number.

The overcurrent detection circuit 12 operates as follows.

When the MOS transistors 2, 3 are turned on at the same time by the gate signal IN applied to the input of the driver circuit 4, the load current IL flows through the load 1 and the MOS transistor 2. An output voltage of the op-amp 5 is controlled such that a drain voltage of the MOS transistor 2 is equal to that of the MOS transistor 3. As a result, a current ratio of the load current IL to a current IM flowing through the MOS transistor 3 is N to 1. For example, when the size ratio of the MOS transistor 2 to the MOS transistor 3 is set to 10 to 1, the current IM is ten times smaller than the load current IL.

The current mirror circuit 6 copies the input current to the output so that the collector current I1 can be equal to the current IM. The collector current I1 flows through the resistor 10 and a voltage is produced across the resistor 10. The voltage sensor 11 determines, based on the voltage, whether the overcurrent condition occurs in the MOS transistor 2. For example, when the voltage exceeds a predetermined threshold voltage, the voltage sensor 11 outputs an overcurrent detection signal IV. Alternatively, the voltage sensor 11 converts the voltage to a digital signal and a central processing unit (CPU) of an external circuit determines, based on the digital signal, whether the overcurrent condition occurs in the MOS transistor 2.

However, as discussed below, the overcurrent detection circuit 12 has a problem to be overcome. A collector voltage Vc(T8) of the transistor 8 is given by:

$$Vc(T8)=Ve(T8)-Vbe(T8)-Vbe(T9) \quad (1)$$

In the above equation (1), Ve(T8) represents an emitter potential of the transistor 8, Vbe(T8) represents a base-emitter voltage of the transistor 8, and Vbe(T9) represents a base-emitter voltage of the transistor 9.

A collector potential Vc(T7) of the transistor 7 is given by:

$$Vc(T7)=R10 \times I1 \quad (2)$$

In the above equation (2), R10 represents a resistance of the resistor 10.

As can be seen by comparing the equations (1) and (2), the collector potential Vc(T8) is different from the collector potential Vc(T7). Therefore, an emitter-collector voltage of the transistor 8 is different from that of the transistor 7 and a difference between the collector current I1 and the current IM is caused by an early effect.

As described above, since the current mirror circuit 6 operates incorrectly due to the early effect, an accuracy of the overcurrent detection circuit 12 to detect the overcurrent condition is reduced.

SUMMARY OF THE INVENTION

In view of the above-described problem, it is an object of the present invention to provide an overcurrent detection circuit in which an accuracy to detect an overcurrent condition is improved by eliminating an influence of an early effect caused in transistors of a current mirror circuit.

An overcurrent detection circuit for detecting an overcurrent condition in an output transistor connected in series with an electrical load includes a pair of transistors having input terminals connected together. The pair of transistors is interposed between a current mirror circuit and a resistor and between the current mirror circuit and a detection transistor capable of being turned on at the same time as the output transistor. When a voltage is applied to the input terminals of the pair of the transistors, output terminals of the current mirror circuit are fixed at the same potential. Thus, even when an early effect occurs in the current mirror circuit, an electric current flowing through the resistor becomes equal to an electric current flowing through the detection transistor. The overcurrent detection circuit can accurately detect the overcurrent condition based on a voltage drop across the resistor.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
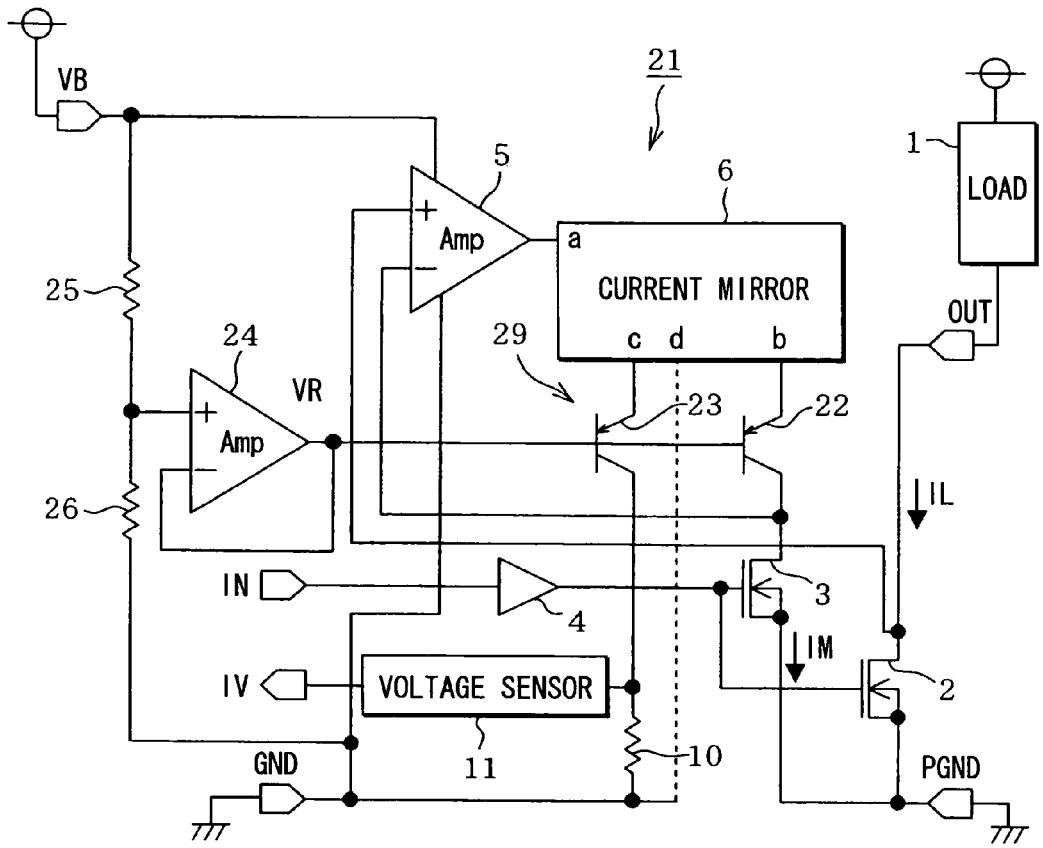
FIG. 1 is a schematic diagram of an overcurrent detection circuit according to a first embodiment of the present invention.

An overcurrent detection circuit 21 according to the first embodiment is shown in FIG. 1. The overcurrent detection circuit 21 detects an overcurrent condition in a MOS transistor 2 connected in series with an electrical load 1. The overcurrent detection circuit 21 includes an early effect cancel circuit 29 in addition to the structure of the overcurrent detection circuit 12 shown in FIG. 22. The early effect cancel circuit 29 has a pair of PNP transistors 22, 23, a voltage buffer 24, and resistors 25, 26. The transistor 22 is connected between a terminal b of a current mirror circuit 6 and a drain of a MOS transistor 3. The transistor 23 is connected between a terminal c of the current mirror circuit 6 and a resistor 10.

Specifically, the transistor 22 has an emitter connected to the current mirror circuit 6, a collector connected to the MOS transistor 3, and a base connected to an output of the voltage buffer 24. The transistor 23 has an emitter connected to the current mirror circuit 6, a collector connected to the resistor 10, and a base connected to the output of the voltage buffer 24. The resistors 25, 26 are connected in series between a power supply voltage VB and a second ground GND and the power supply voltage VB is divided between the resistors 25, 26. The divided voltage is applied to a non-inverting input of the voltage buffer 24 so that the voltage buffer 24 outputs a predetermined voltage VR to the bases of the transistors 22, 23.

Figure 2A:
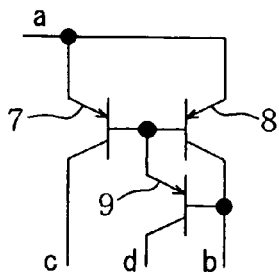
FIGS. 2A-2C are schematic diagrams of a current mirror circuit in the overcurrent detection circuit of FIG. 1.
Figure 2B:
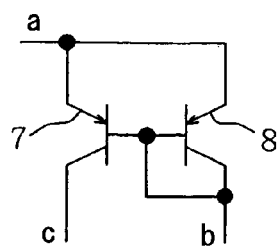
Figure 2C:
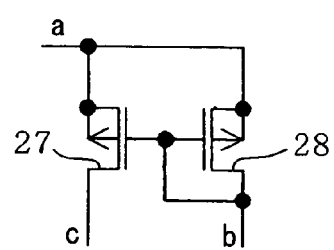

For example, the current mirror circuit 6 is constructed as shown in FIGS. 2A-2C. As with the overcurrent detection circuit 12, the current mirror circuit 6 may be constructed with three transistors 7-9 as shown in FIG. 2A. Bases of the transistors 7, 8 are connected together and emitters of the transistors 7, 8 are also connected together. The transistor 9 has an emitter connected to the bases of the transistors 7, 8 and a base connected to a collector of the transistor 8. Alternatively, the current mirror circuit 6 may be constructed with two transistors 7, 8 as shown in FIG. 2B. Alternatively, the current mirror circuit 6 may be constructed with two MOS transistors 27, 28 as shown in FIG. 2B. Gates of the MOS transistors 27, 28 are connected together and sources of the MOS transistors 27, 28 are also connected together.

The overcurrent detection circuit 21 operates as follows.

Each collector potential of the transistors 7, 8 is given by subtracting a base-emitter voltage Vbe of the transistors 22, 23 from the voltage VR applied to the bases of the transistors 22, 23 by the voltage buffer 24. Thus, the collector potentials of the transistor 7 are kept equal to each other by functions of the early effect cancel circuit 29. Therefore, even when the early effect occurs in the transistors 7, 8, collector-emitter voltages of the transistors 7, 8 are kept equal to each other so that an influence of the early effect on the current mirror circuit 6 can be negligible. The current mirror circuit 6 operates correctly so that collector currents of the transistors 7, 8 become equal to each other. Thus, an accuracy of the overcurrent detection circuit 21 to detect the overcurrent condition can be maintained by the functions of the early effect cancel circuit 29 so that the overcurrent detection circuit 21 can operate correctly and stably.

In addition to the advantage described above, the early effect cancel circuit 29 provides further advantages.

Figure 22:
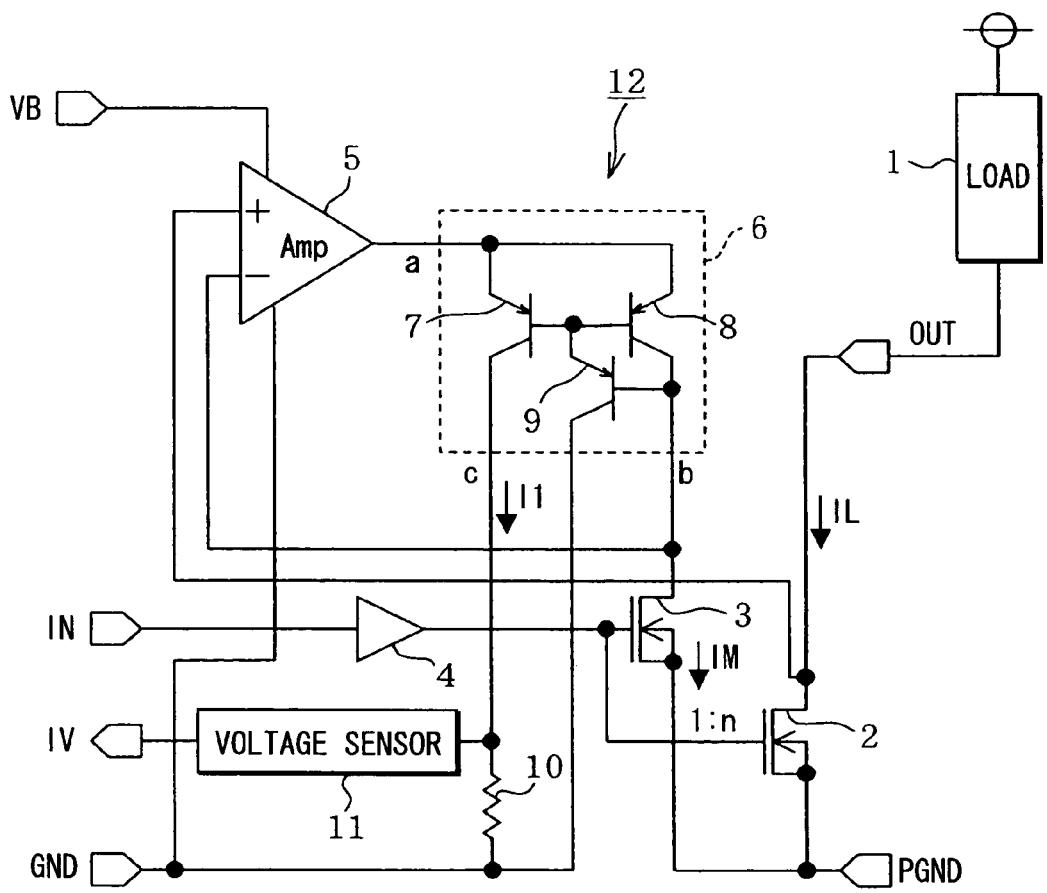
FIG. 22 is a schematic diagram of the conventional overcurrent detection circuit.

The overcurrrent detection circuit 12 shown in FIG. 22 has two problems and the first problem is as follows: When the overcurrent detection circuit 12 is used for a system in which the load current IL becomes large, the first ground PGND may be separated (i.e., different) from the second ground GND to prevent influence of noise. Although the first and second grounds PGND, GND are basically at the same potential, the load current IL may cause a potential difference between the first and second grounds PGND, GND. As a result, the overcurrent detection circuit 21 may operate incorrectly and unstably.

For example, it is assumed that the potential of the second ground GND is 0 volt (V) and the first ground PGND is minus(−) 1.5 V. A drain-source voltage of the MOS transistor 2 is remarkably small, when the load current IL is relatively small. As a result, a drain potential of the MOS transistor 2 becomes approximately −1.5 V. The op-amp 5 acts to reduce the voltage VR applied to the early effect cancel circuit 29, when the drain voltage of the MOS transistor 3 is greater than that of the MOS transistor 2. However, the voltage VR cannot be reduced below 0 V because the op-amp 5 is grounded to the second ground GND.

Since two transistors 7 (or 8), 9 are connected between the output of the op-amp 5 and the drain of the MOS transistor 3, a voltage drop of two base-emitter voltages (i.e., 2 Vbe) occurs between the output of the op-amp 5 and the drain of the MOS transistor 3. For example, the base-emitter voltage Vbe may be approximately 0.5 V under a high temperature condition in a vehicle (e.g. at 150 Celsius degrees). In this case, a potential difference of 0.5 V occurs between the drain potentials of the MOS transistors 2, 3 because the drain potential of the MOS transistor 3 cannot be reduced below −1.0 V. As a result, the current ratio of the load current IL flowing through the MOS transistor 2 to the current IM flowing through the MOS transistor 3 is not N to 1. Therefore, the accuracy of the overcurrent detection circuit 21 is reduced so that the overcurrent detection circuit 21 operates incorrectly.

Figure 3:
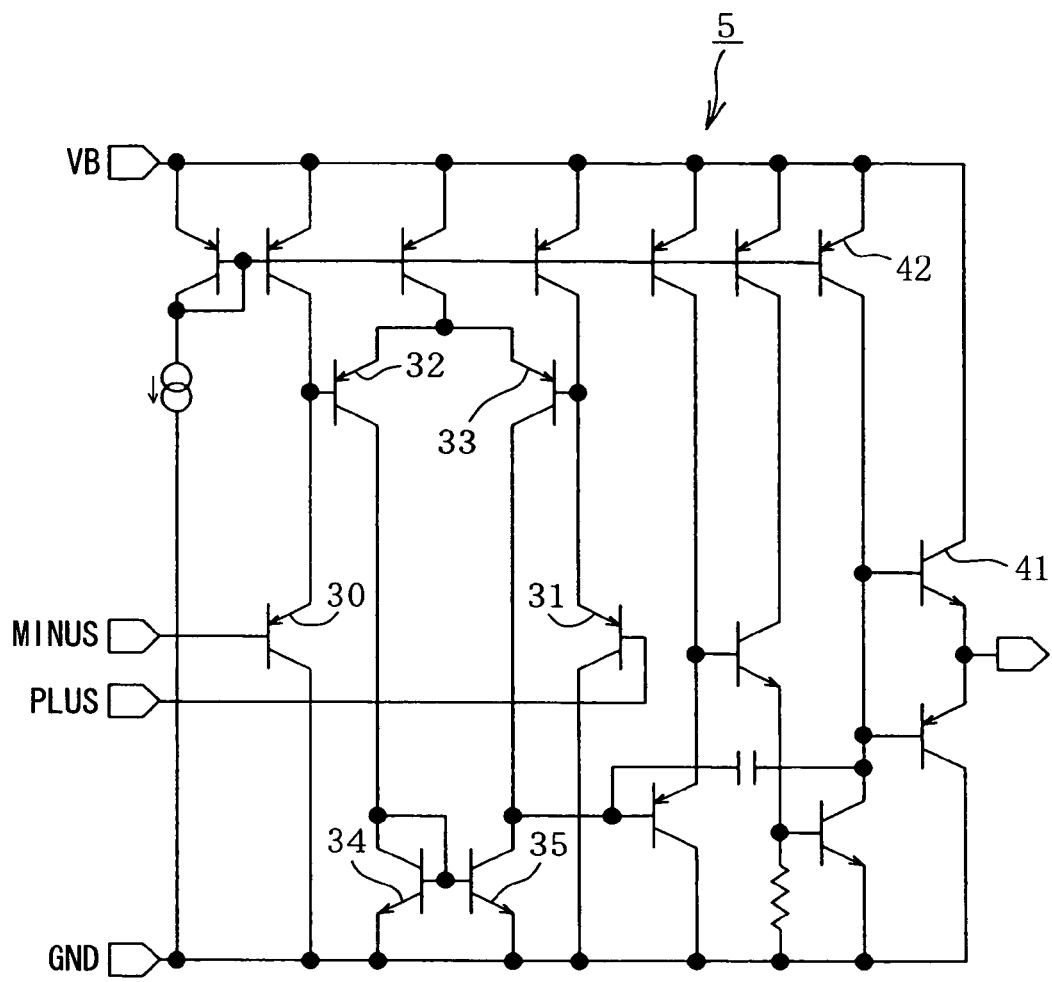
FIG. 3 is a schematic diagram of a typical op-amp.

The second problem of the overcurrent detection circuit 12 is as follows: The op-amp 5 is generally constructed as shown in FIG. 3. Transistors 30-33 provide an input differential pair and transistors 34, 35 provide a current mirror circuit for comparing two currents flowing through the input differential pair. A minimum input voltage required to turn on the transistor 34 is given by:

$$Vbe(T34)+Vsat(T32)-Vbe(T32)-Vbe(T30) \quad (3)$$

In the above expression (3), Vsat(T32) represents a collector-emitter saturation voltage of the transistor 32. For example, when the base-emitter voltage Vbe is 0.5 V and the collector-emitter saturation voltage Vsat(T32) is 0.1 V, a common-mode input voltage of the op-amp 5 is −0.4 V. Therefore, when the potential of the first ground PGND is −1.5V, the op-amp 5 does not work.

Figure 4:
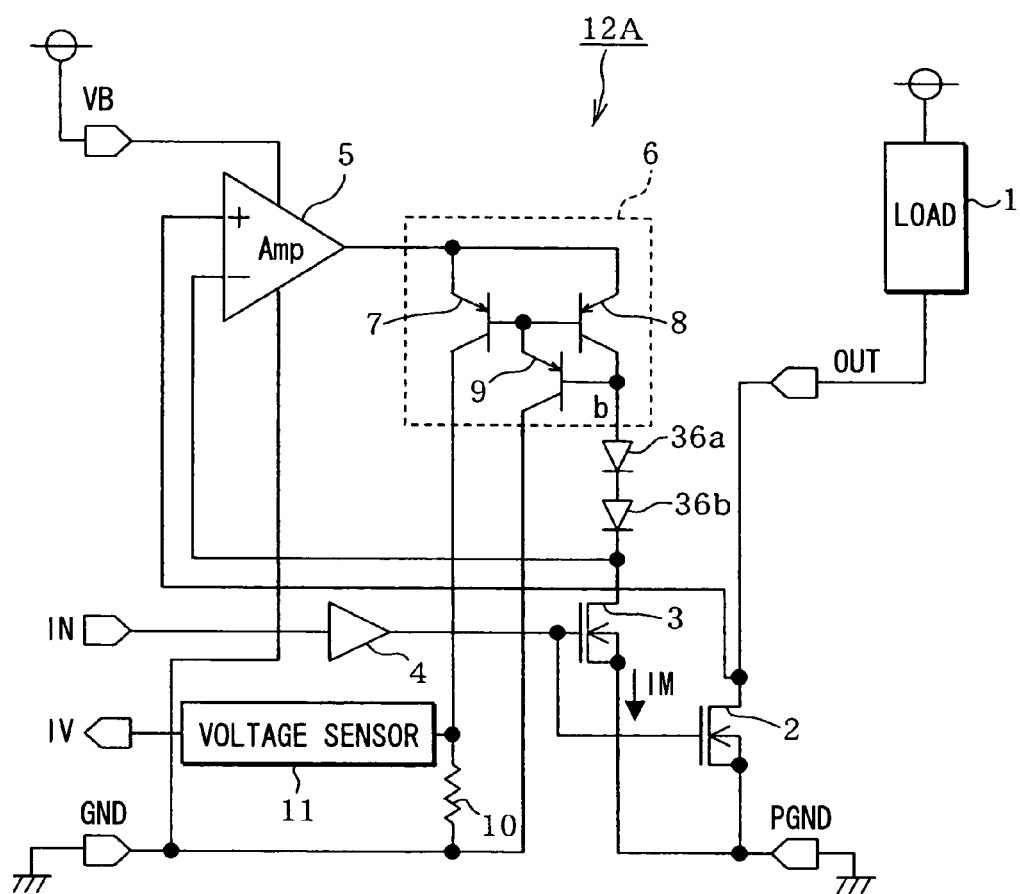
FIG. 4 is a schematic diagram of an overcurrent detection circuit to which an improvement is made to overcome a problem of a conventional overcurrent detection circuit of FIG. 22.

An overcurrent detection circuit 12A shown in FIG. 4 overcomes the first problem. The overcurrent detection circuit 12A includes two level shifting diodes 36a, 36b that are connected in series between the collector of the transistor 8 and the drain of the MOS transistor 3. In such an approach, the drain potential of the MOS transistor 3 can be reduced up to −2.0 V. Therefore, even when the potential of the first ground PGND is −1.5 V and the output voltage of the op-amp 5 is 0 V, the drain potential of the MOS transistor 3 can become −1.5 V. Thus, the current mirror circuit 6 can operate correctly so that the overcurrent detection circuit 12A can operate correctly.

Figure 5:
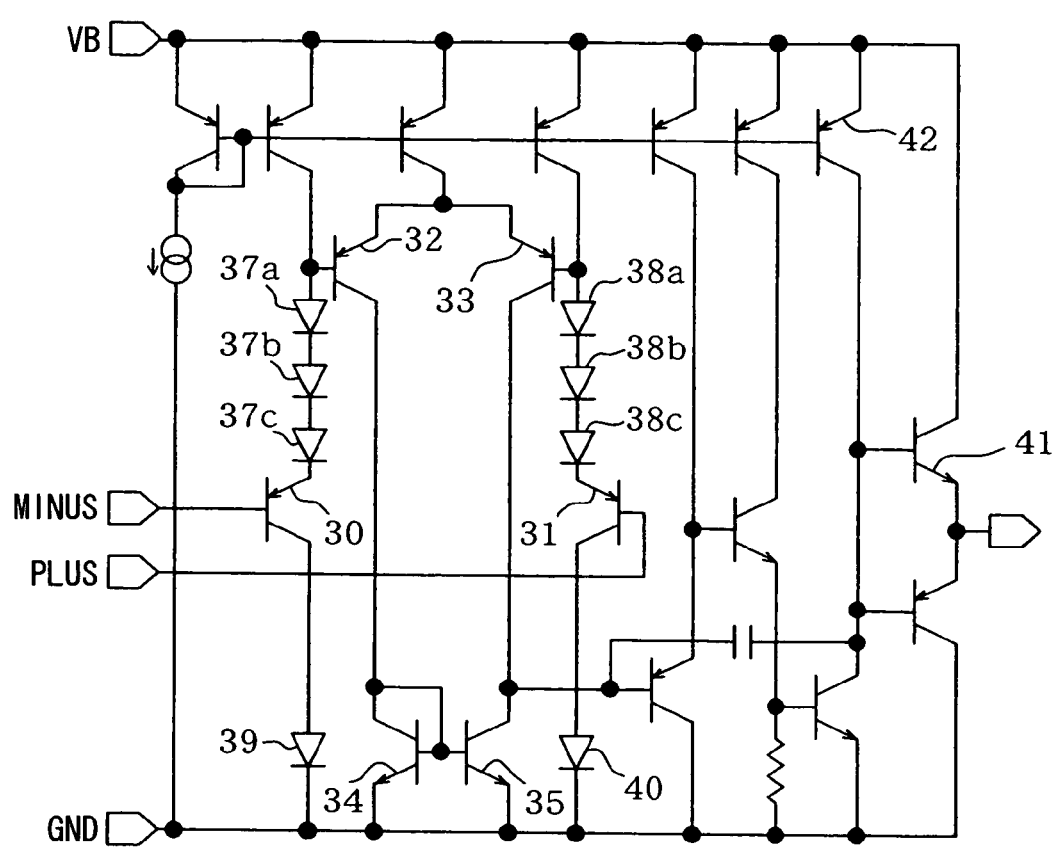
FIG. 5 is a schematic diagram of an op-amp to which an improvement is made to overcome a problem of the conventional overcurrent detection.

An op-amp 5A shown in FIG. 5 overcomes the second problem. The op-amp 5A has level shift diodes 37a-37c, level shift diodes 38a-38c, reverse current protection diodes 39, 40, an NPN transistor 41 acting as output transistor and PNP transistors 42 constructing a current mirror circuit. The level shift diodes 37a-37c are connected in series between the base of the transistor 32 and the emitter of the transistor 30. The level shift diodes 38a-38c are connected in series between the base of the transistor 33 and the emitter of the transistor 31. The protection diodes 39, 40 are connected between the collectors of the transistors 30, 31 and the second ground GND, respectively. In the op-amp 5A, the minimum input voltage required to turn on the transistor 34 is given by:

$$Vbe(T34)+Vsat(T32)-Vbe(T32)-VA-Vbe(T30) \quad (4)$$

In the above expression. (4), VA represents a level shift voltage produced by the level shift diodes 37a-37c. For example, when the level shift voltage VA is 1.5 V (i.e., 0.5 V×3), the minimum input voltage is −1.9 V. Therefore, even when the potential of the first ground PGND is −1.5 V, the op-amp 5A can work. The protection diodes 39, 40 prevent a reverse current from the second ground GND to the inputs of the op-amp 5A when the input voltage of the op-amp 5A is reduced below 0 V.

As described above, the overcurrent detection circuit 12A shown in FIG. 4 overcomes the first problem of the overcurrent detection circuit 12 and the op-amp 5A shown in FIG. 5 overcomes the second problem of the overcurrent detection circuit 12. Therefore, it seems that each of the first and second problems can be overcome by a combination of the overcurrent detection circuit 12A and the op-amp 5A. However, another problem is caused by the combination.

For example, when the potential of the first ground PGND is 1.5 V, a minimum power supply voltage VBmin required to drive the op-amp 5A is given by:

$$VBmin=1.5+Ron \times IM+Vf \times 2+Vbe(T9)+Vbe(T8)+Vbe(T41)+Vsat(T42) \quad (5)$$

In the above equation (5), Ron represents an ON-resistance of the MOS transistor 3, IM represents the current flowing through the MOS transistor 3, Vf represents a forward-bias voltage of the diodes 36a, 36b, Vbe(T41) is a base-emitter voltage of the output transistor 41, and Vsat(T42) is a collector-emitter saturation voltage of each of the transistors 42.

For example, each of the base-emitter voltage Vbe and the forward-bias voltage Vf may be approximately 0.5 V under a low temperature condition in the vehicle (e.g. at −40 Celsius degrees). When Ron×IM=0.1 V and the collector-emitter saturation voltage Vsat(T42) is 0.1 V, the minimum power supply voltage VBmin is 6.2 V. Therefore, the combination of the overcurrent detection circuit 12A and the op-amp 5A cannot be applied to a system that uses the power supply voltage VB of about 6 V.

In contrast, in the overcurrent detection circuit 21 shown in FIG. 1, the minimum power supply voltage VBmin required to drive the op-amp 5 is given by:

$$VBmin=VR+Vbe(T22)+Vbe(T9)+Vbe(T8)+Vbe(T41)+Vsat(T42) \quad (6)$$

Therefore, when the voltage VR applied to the early effect cancel circuit 29 by the voltage buffer 24 is 1.5 V, the base-emitter voltage Vbe is 0.9 V, and the emitter-collector saturation voltage Vsat is 0.1 V, the minimum power supply voltage VBmin is 5.2 V. The minimum power supply voltage VBmin of the overcurrent detection circuit 21 is less by 1 V than that of the combination of the overcurrent detection circuit 12A and the op-amp 5A. The overcurrent detection circuit 21 can operate correctly at the power supply voltage VB of 6V.

In the overcurrent detection circuit 21, the minimum power supply voltage VBmin is independent of the potential of the first ground PGND and the ON resistance of the MOS transistor 3. The minimum power supply voltage VBmin is determined based on the voltage VR applied to the early effect cancel circuit 29 by the voltage buffer 24. Therefore, the minimum power supply voltage VBmin can be adjusted by adjusting the voltage VR.

In the overcurrent detection circuit 21 according to the first embodiment, the early effect cancel circuit 29 is interposed between the current mirror circuit 6 and the MOS transistor 3 and the resistor 10 for detecting the output current of the current mirror circuit 6. The early effect cancel circuit 29 prevents the early effect in the transistors 7, 8 from affecting the current mirror circuit 6. Thus, the current mirror circuit 6 can operate correctly so that the overcurrent detection circuit 21 can accurately detect the overcurrent condition in the MOS transistor 2, i.e., the load 1.

Further, the early effect cancel circuit 29 reduces the minimum power supply voltage VBmin that is required to drive the op-amp 5 when the potential of the first ground PGND is higher than that of the second ground GND.

Second Embodiment

Figure 6:
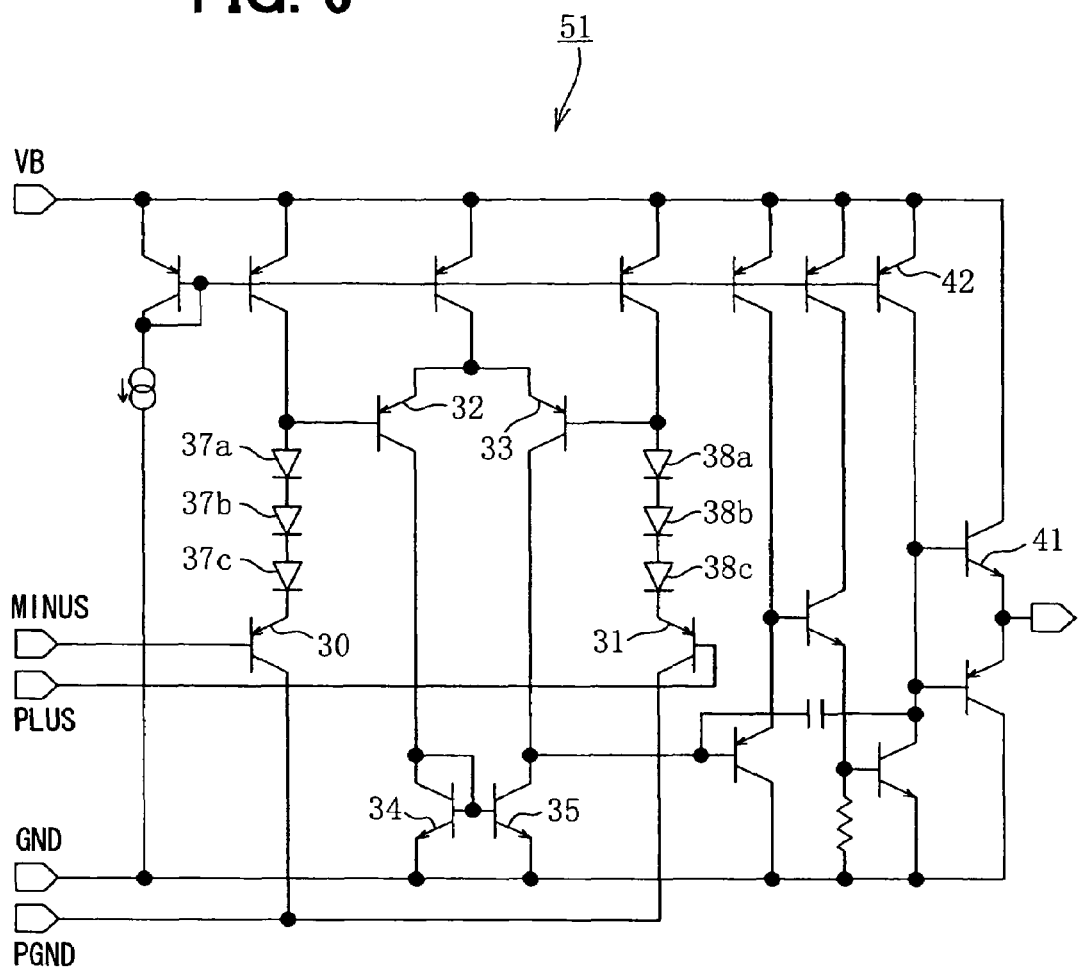
FIG. 6 is a schematic diagram of an op-amp in an overcurrent detection circuit according to a second embodiment of the present invention.

An op-amp 51 according to the second embodiment is shown in FIG. 6. The op-amp 51 is similar in structure to the op-amp 5A shown in FIG. 5. As can be seen by comparing FIGS. 5 and 6, differences between the op-amp 51 and the op-amp 5A are that the op-amp 51 does not includes the reverse current protection diodes 39, 40 and the collectors of the transistors 30, 31 are directly connected to the first ground PGND.

Since the op-amp 5A includes the protection diodes 39, 40, the forward bias voltage Vf of the protection diodes 39, 40 is applied to collectors of the transistors 30, 31, respectively. For example, when the input voltage to the op-amp 5A is 0 V, the emitter potentials of the transistors 30, 31 depend on the respective base-emitter voltages Vbe. In this case, the collector-emitter voltages of the transistors 30, 31 become equal to 0 V because the base-emitter voltage Vbe is generally equal to the forward bias voltage Vf. As a result, each of the transistors 30, 31 operates in the saturation region. A reduction in a DC current gain hFE of the transistors 30, 31 occur and a large proportion of the emitter current is made up of the base current. Therefore, the input current to the op-amp 5A increases with a decrease in the input voltage to the op-amp 5A and a detection error may be caused by an impedance difference on the input side of the op-amp 5A.

In contrast, in the op-amp 51, the protection diodes 39, 40 are eliminated to prevent the transistors 30, 31 from operating in the saturation region. An emitter voltage Ve(T30) and an collector voltage Vc(T30) of the transistor 30 are given by:

$$Ve(T30)=VPG+Ron \times IM+Vbe(T30) \quad (7)$$

$$Vc(T30)=VPG \quad (8)$$

In equations (7), (8), VPG represents the potential of the first ground PGND. From the equations (7), (8), a collector-emitter voltage Vce(T30) is given by:

$$Vce(T30)=Vc(T30)-Ve(T30)=-Ron \times IM-Vbe(T30) \quad (9)$$

When the current IM is very small, −Ron×IM is appoloximately 0 V. Even when −Ron×IM is appoloximately 0 V, the base-emitter voltage Vbe(T30) prevents the transistor 30 from operating in the saturation region. Therefore, the reduction in the DC current gain hFE of the transistors 30, 31 can be prevented so that the increase in the input current to the op-amp 51 can be prevented. This approach prevents the detection error from being caused by the impedance difference on the input side of the op-amp 5A. Thus, the overcurrent detection circuit 21 can detect the overcurrent condition more accurately by using the op-amp 51 instead of the op-amp 5.

According to the second embodiment, the collectors of the transistors 30, 31 are directly connected to the first ground PGND. In such an approach, the op-amp 51 can operate without or with reduced the level shifting elements, even when the potential of the first ground PGND is reduced relative to that of the second ground GND. Since the op-amp 51 does not include the protection diodes 39, 40, the transistors 30, 31 can be prevented form operating in the saturation region. Thus, the overcurrent detection circuit 21 can detect the overcurrent condition more accurately by using the op-amp 51 instead of the op-amp 5.

Third Embodiment

Figure 7:
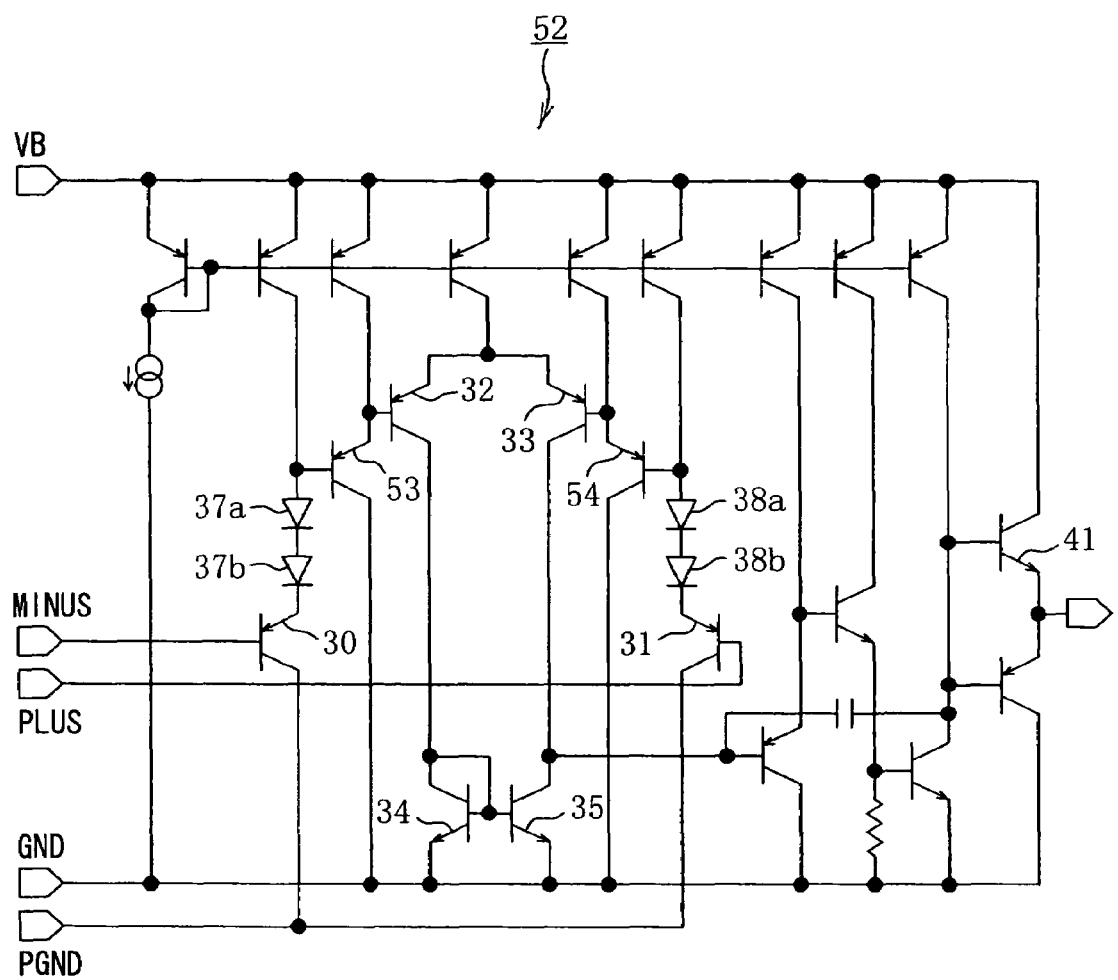
FIG. 7 is a schematic diagram of an op-amp in an overcurrent detection circuit according to a third embodiment of the present invention.

An op-amp 52 according to the third embodiment is shown in FIG. 7. The op-amp 52 is similar in structure to the op-amp 51 shown in FIG. 6. As can be seen by comparing FIGS. 6 and 7, differences between the op-amp 52 and the op-amp 51 are that the op-amp 52 includes PNP transistors 53, 54 and does not includes the level shifting diodes 37c, 38c. The transistors 53, 54 are connected between the anodes of the diodes 37a, 38a and the bases of the transistors 32, 33, respectively. Thus, the number of the input differential pairs is increased.

Fourth Embodiment

Figure 8:
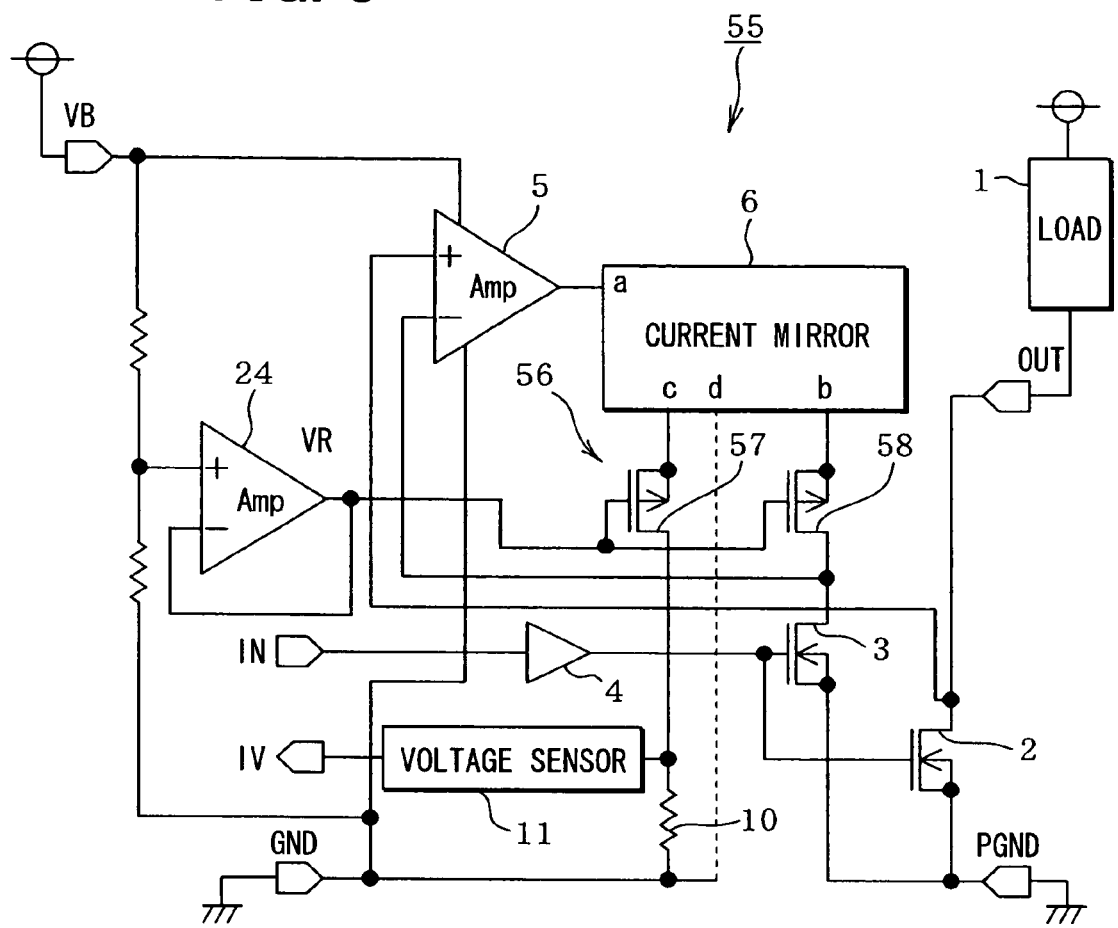
FIG. 8 is a schematic diagram of an overcurrent detection circuit according to a fourth embodiment of the present invention.

An overcurrent detection circuit 55 according to the fourth embodiment is shown in FIG. 8. A difference between the overcurrent detection circuit 55 and the overcurrent detection circuit 21 shown in FIG. 1 is that the overcurrent detection circuit 55 includes an early effect cancel circuit 56 instead of the early effect cancel circuit 29. A difference between the early effect cancel circuit 56 and the early effect cancel circuit 29 is that the early effect cancel circuit 56 includes P-channel MOS transistors 57, 58 instead of the transistors 22, 23. In such an approach, the collector potential of the transistors 8, 9 of the current mirror circuit 6 are set greater by a threshold voltage of the MOS transistors 57, 58 than the voltage VR applied to gates of the MOS transistors 57, 58.

Fifth Embodiment

Figure 9:
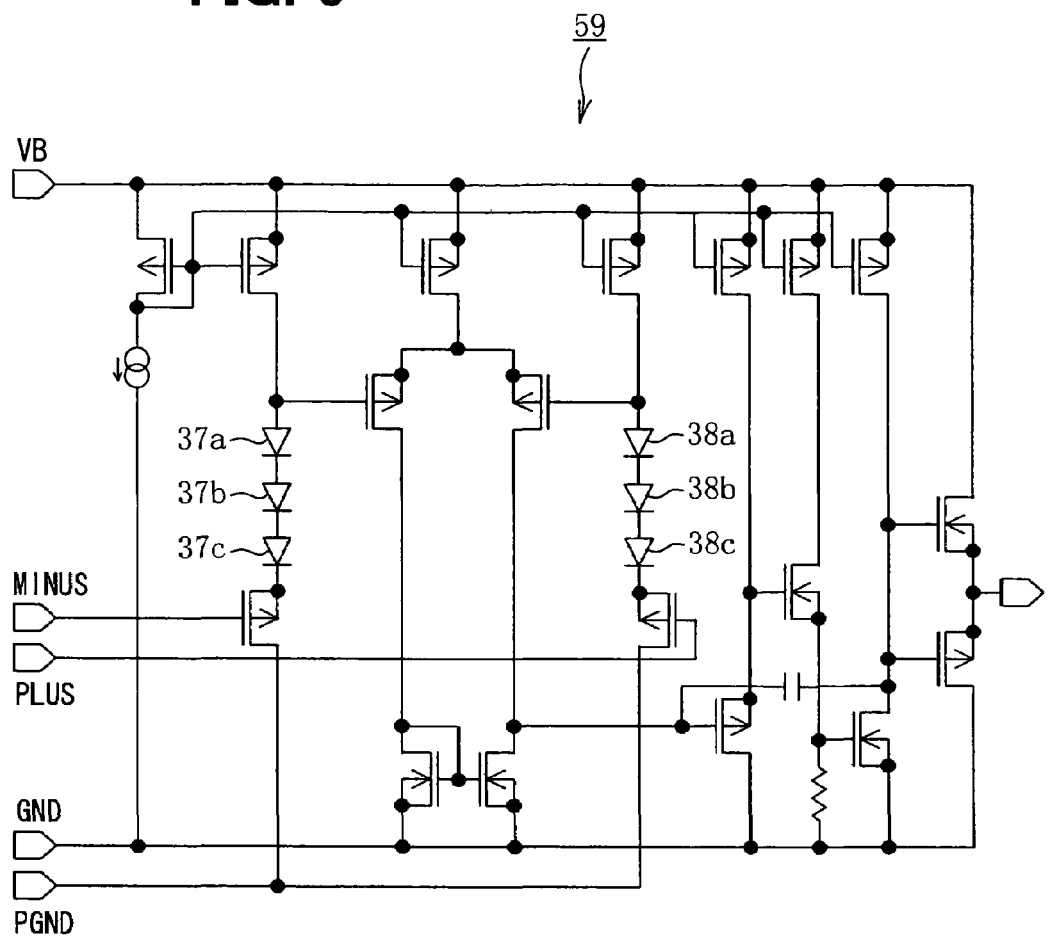
FIG. 9 is a schematic diagram of an op-amp of an overcurrent detection circuit according to a fifth embodiment of the present invention.

An op-amp 59 according to the fifth embodiment is shown in FIG. 9. The op-amp 59 is similar in structure to the op-amp 51 shown in FIG. 6. As can be seen by comparing FIGS. 6 and 9, a difference between the op-amp 59 and the op-amp 51 is that all the bipolar transistors are replaced with MOS transistors.

Sixth Embodiment

Figure 10:
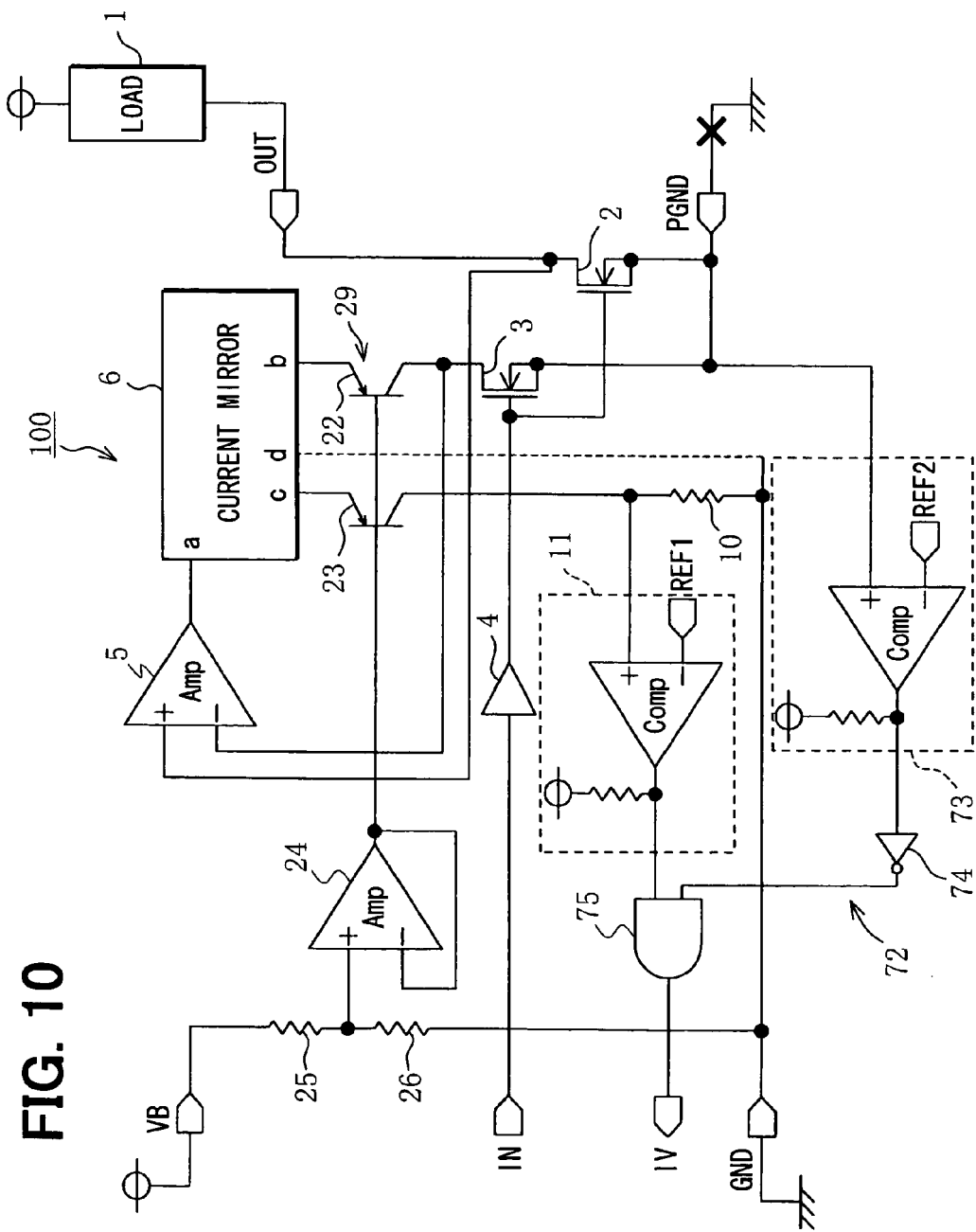
FIG. 10 is a schematic diagram of an overcurrent detection circuit according to a sixth embodiment of the present invention.

An overcurrent detection circuit 100 according to the sixth embodiment is shown in FIG. 10. The overcurrent detection circuit 100 is similar in structure to the overcurrent detection circuit 21 shown in FIG. 1. As can be seen by comparing FIGS. 1 and 10, a difference between the overcurrent detection circuit 100 and the overcurrent detection circuit 21 is that the overcurrent detection circuit 100 includes a detection error prevention circuit 72.

In the overcurrent detection circuit 100, the voltage sensor 11 is shown in detail and constructed by a first comparator having an inverting input supplied with a first reference voltage REF1 and a non-inverting input connected between the resistor 10 and the collector of the transistor 23. An output of the first comparator is pulled up.

The error prevention circuit 72 includes a voltage sensor 73, an NOT-gate 74, and an AND-gate 75. The voltage sensor 73 is constructed by a second comparator having an inverting input supplied with a second reference voltage REF2 and a non-inverting input connected to the first ground PGND. An output of the second comparator is pulled up. The AND-gate 75 has a first input connected to the output of the voltage sensor 11 and a second input connected to an output of the voltage sensor 73 through the NOT-gate 74.

Thus, the voltage sensor 11 detects the overcurrent by comparing the voltage across the resistor 10 with the first reference voltage REF1. The voltage sensor 73 detects an excessive increase in the potential of the load-side ground PGNG by comparing the potential of the load-side ground PGNG with the second reference voltage REF2.

Differences in behavior between the overcurrent detection circuits 21, 100 are described below.

As described in the first embodiment, the first ground PGND may be separated from the second ground GND to prevent the influence of noise. A ground wire connected to the first ground PGND may be broken by, for example, vibrations produced when the vehicle is running. As a result, an open-circuit in the ground wire occurs.

In the overcurrent detection circuit 21, if the MOS transistors 2, 3 are turned on under the condition that the open-circuit occurs, the load current flowing through the load 1 increases the source potential of the MOS transistor 2. Then, the load current flows from the source to the drain of the MOS transistor 3, flows from the collector to the base of the transistor 22, and flows into the output of the voltage buffer 24.

As a result, the drain voltage of the MOS transistor 3 becomes less than that of the MOS transistor 2. Therefore, the op-amp 5 increases its output voltage so that the voltage VR applied to the early effect cancel circuit 29 is increased. Accordingly, a current flowing from the current mirror circuit 6 into the early effect cancel circuit 29 is increased and a portion of the current flows from the emitter to the base of the transistor 22.

Figure 11:
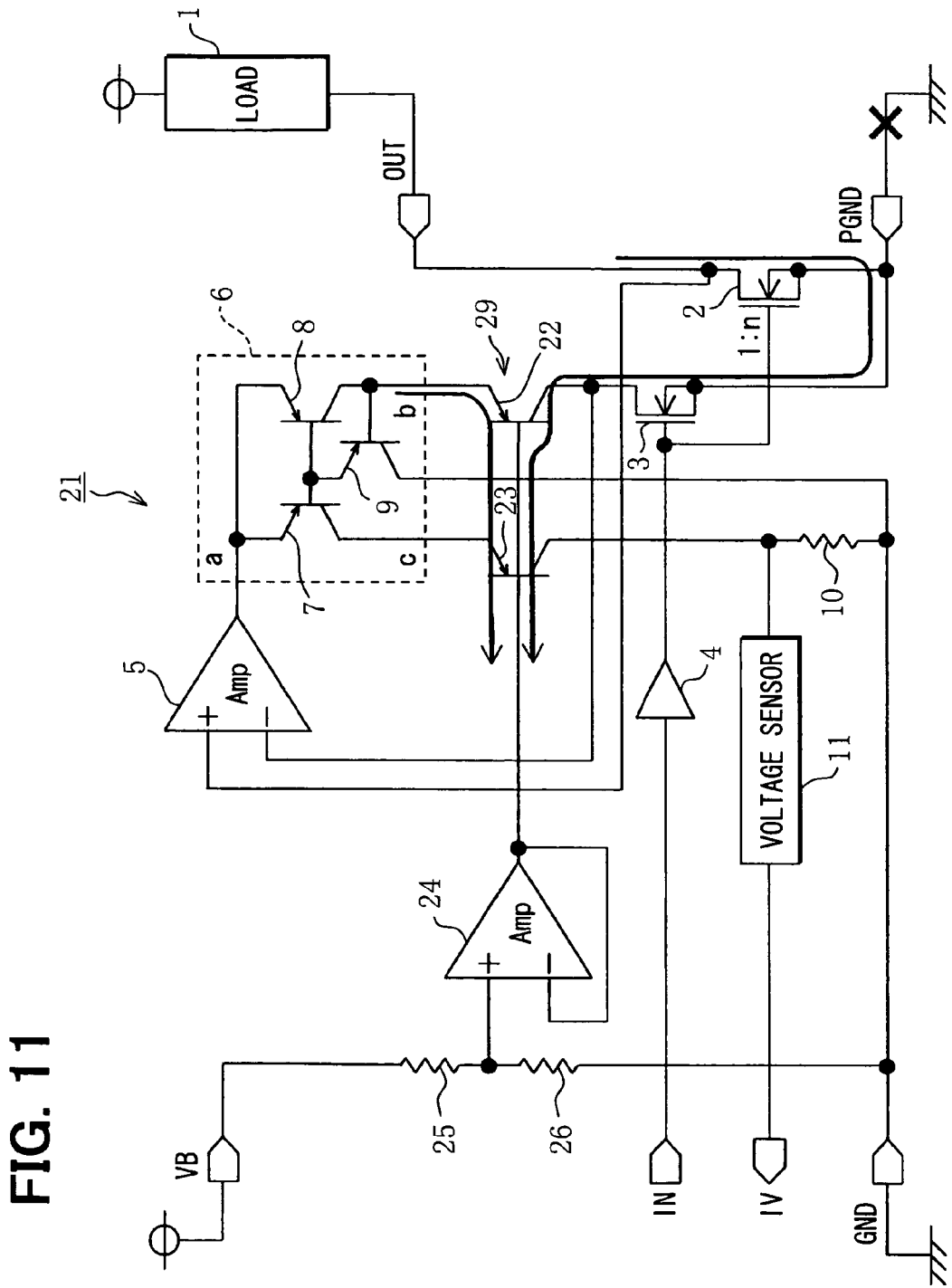
FIG. 11 is a schematic diagram showing a current flow in the overcurrent detection circuit of FIG. 1 observed when an open-circuit occurs.

In short, as shown in FIG. 11, a current not only flows from the collector to the base but also flows from the emitter to the base of the transistor 22 at one time. As a result, the emitter and the collector potentials of the transistor 22 become approximately equal to each other and the transistor 22 operates in the saturation region. Therefore, even when the op-amp 5 provides a current to the early effect cancel circuit 29 through the current mirror circuit 6, a large portion of the current forms the base current and flows to the voltage buffer 24, not the MOS transistor 3. Thus, the drain voltage of the MOS transistor 3 is not increased.

In this case, since the op-amp 5 provides the current to the early effect cancel circuit 29 at its peak performance regardless of the load current, a large current flows through the transistor 23. The voltage sensor 11 detects the voltage produced across the resistor 10 by the large current and outputs the overcurrent detection signal IV. As a result, the overcurrent detection circuit 21 incorrectly detects the overcurrent. In other words, the overcurrent detection circuit 21 detects the overcurrent, despite the fact that the overcurrent does not actually occur.

In the overcurrent detection circuit 100 according to this embodiment, the error prevention circuit 72 overcomes the above problem as follows:

When the potential of the first ground PGND is lower than the second reference voltage REF2, the output of the voltage sensor 73 is low. In this case, the voltage sensor 11 can output the overcurrent detection signal IV through the AND-gate 75. In contrast, when the potential of the first ground PGND is increased above the second reference voltage REF2 due to the open-circuit in the ground wire, the output of the voltage sensor 73 changes from low to high. In this case, the AND-gate 75 blocks the overcurrent detection signal IV output from the voltage sensor 73. Thus, the error prevention circuit 72 prevents the overcurrent detection circuit 100 from incorrectly detecting the overcurrent.

According to this embodiment, the early effect cancel circuit 29 makes the influence of the early effect on the transistors 7, 8 negligible so that the overcurrent can be accurately detected. Further, the error prevention circuit 72 disables the overcurrent detection signal IV output from the voltage sensor 11 when the potential of the first ground PGND is increased above the second reference voltage REF2 due to the open-circuit in the ground wire. In short, the error prevention circuit 72 disables the overcurrent detection signal IV in response to an electrical change in the overcurrent detection circuit 100. Thus, the error prevention circuit 72 prevents the overcurrent detection circuit 100 from incorrectly detecting the overcurrent. The overcurrent detection circuit 100 can be effectively applied to the system used under vibration conditions (e.g., in the vehicle), where the open-circuit in the wire is likely to occur.

Seventh Embodiment

Figure 12:
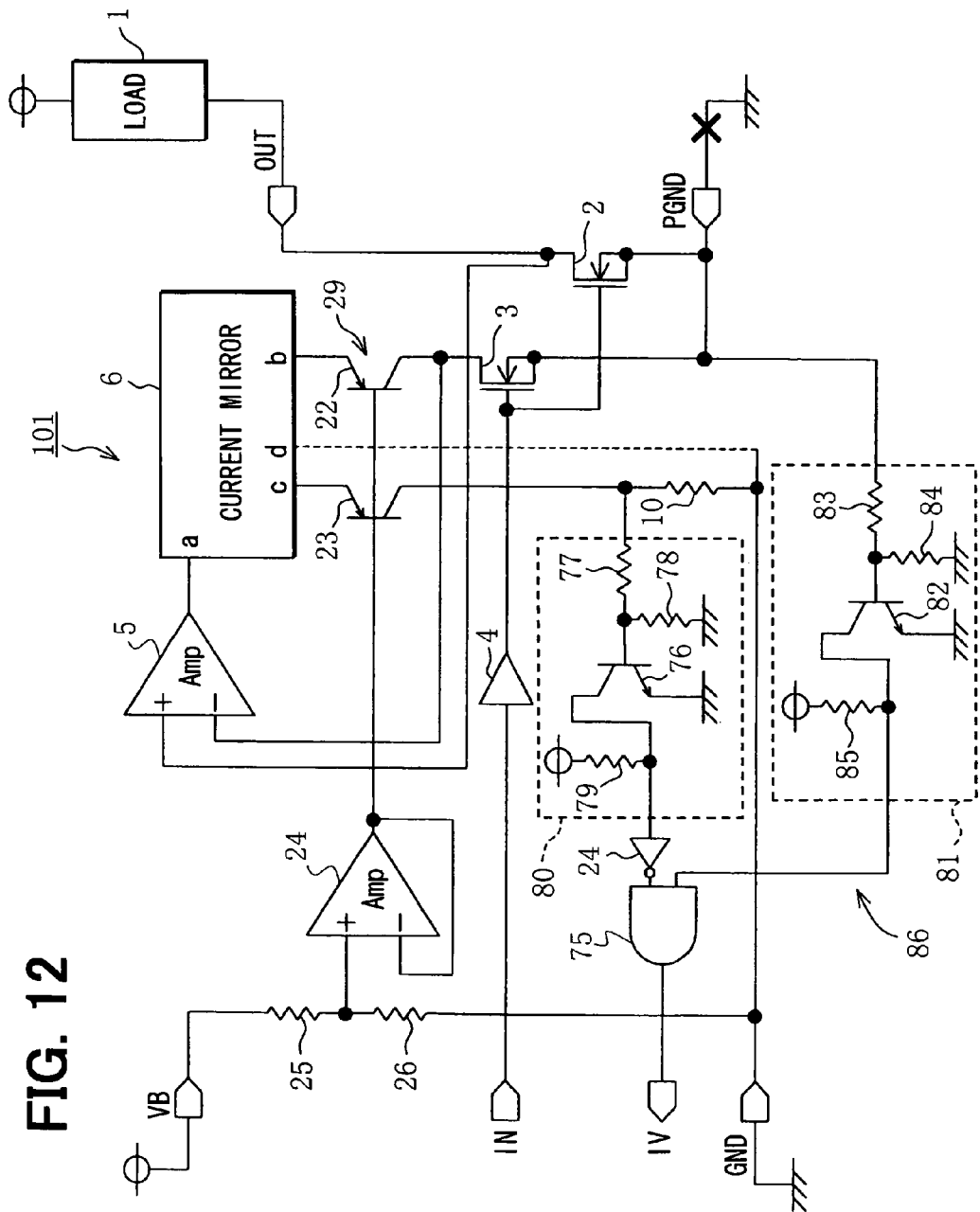
FIG. 12 is a schematic diagram of an overcurrent detection circuit according to a seventh embodiment of the present invention.

An overcurrent detection circuit 101 according to the seventh embodiment is shown in FIG. 12. The overcurrent detection circuit 101 is similar in structure to the overcurrent detection circuit 100 shown in FIG. 10. As can be seen by comparing FIGS. 10 and 12, differences between the overcurrent detection circuits 100, 101 are that a detection error prevention circuit 86 and a voltage sensor 80 replace the detection error prevention circuit 72 and the voltage sensor 11, respectively.

The voltage sensor 80 includes an NPN transistor 76 and resistors 77-79. The resistor 10 is connected to a base of the transistor 76 through the resistor 77 and connected to the second ground GND through the resistor 78 at one end. The transistor 30 has an emitter connected to the second ground GND and a collector pulled up to the power supply voltage VB through the resistor 79.

The prevention circuit 86 includes a voltage sensor 81 instead of the voltage sensor 73, the NOT-gate 74, and the AND-gate 75. The voltage sensor 81 has a similar structure to the voltage sensor 80. Specifically, the voltage sensor 80 includes an NPN transistor 82 and resistors 83-85. The first ground PGND is connected to a base of the transistor 82 through the resistor 83 and connected to the second ground GND through the resistor 84. The transistor 82 has an emitter connected to the second ground GND and a collector pulled up to the power supply voltage VB through the resistor 85.

The collector (i.e., output of the voltage sensor 80) of the transistor 76 is connected to the first input of the AND-gate 75 through the NOT-gate 74. The collector (i.e., output of the voltage sensor 81) of the transistor 82 is connected to the second input of the AND-gate 75.

The voltage across the resistor 10 is divided between the resistors 77, 78. When the divided voltage is increased and the transistor 76 is turned on, the collector of the transistor 76 is grounded to the second ground GND. As a result, the output of the voltage sensor 80 changes from high to low. Likewise, the potential of the first ground PGND is divided between the resistors 83, 84. When the divided voltage is increased and the transistor 82 is turned on, the collector of the transistor 82 is grounded to the second ground GND. As a result, the output of the voltage sensor 81 changes from high to low.

In such an approach, when the potential of the load-side ground GND is relatively low, the voltage sensor 80 can output the overcurrent detection signal IV through the NOT-gate 74 and the AND-gate 75. When the potential of the load-side ground GND is increased due to the open-circuit in the ground wire, the AND-gate 75 blocks the overcurrent detection signal IV output from the voltage sensor 80. Thus, the overcurrent detection circuit 101 according to this embodiment can operate in the same manner as the overcurrent detection circuit 100.

Eighth Embodiment

Figure 13:
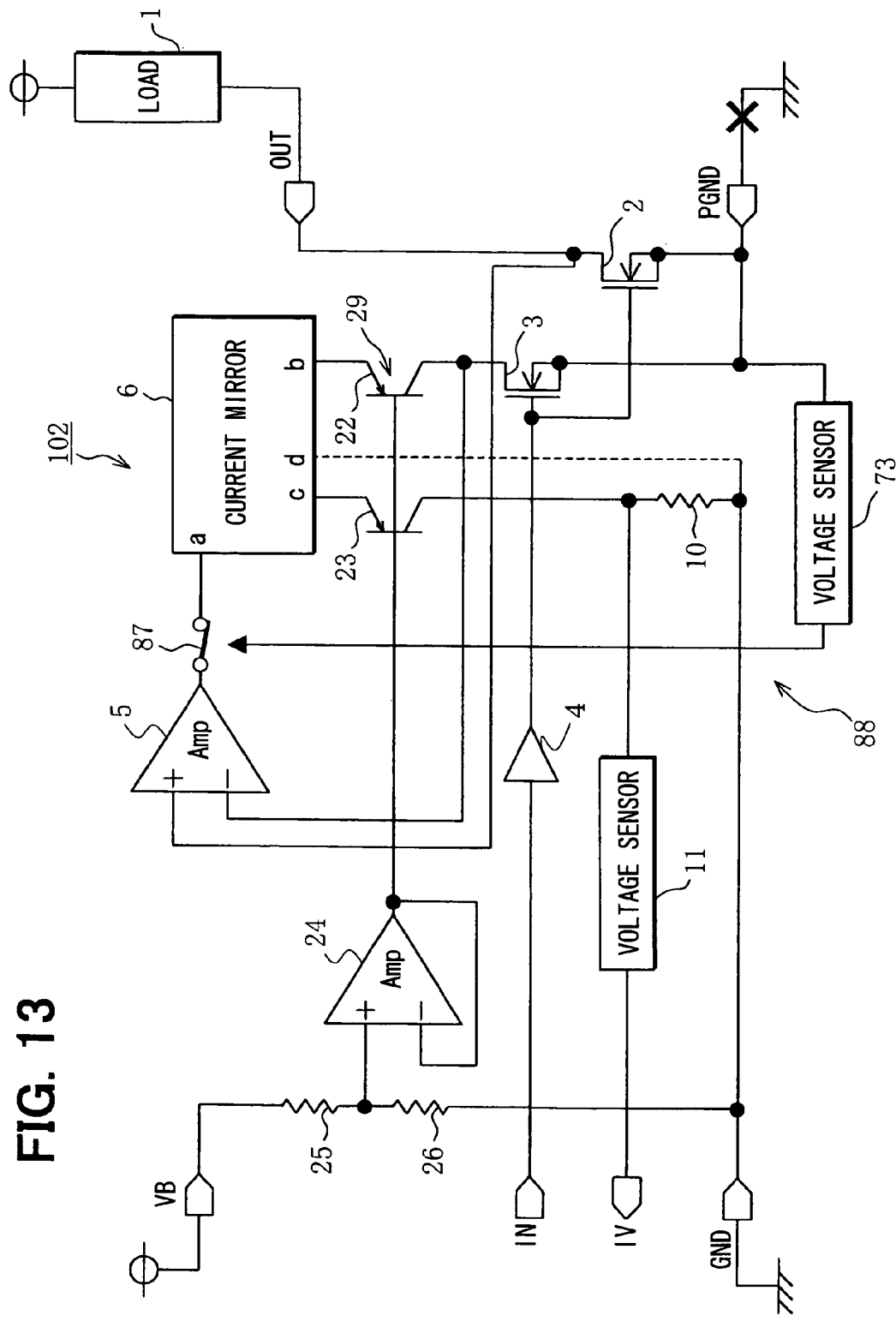
FIG. 13 is a schematic diagram of an overcurrent detection circuit according to an eighth embodiment of the present invention.

An overcurrent detection circuit 102 according to the eighth embodiment is shown in FIG. 13. The overcurrent detection circuit 102 is similar in structure to the overcurrent detection circuit 100 shown in FIG. 10. As can be seen by comparing FIGS. 10 and 13, a difference between the overcurrent detection circuits 100, 102 is that the overcurrent detection circuit 102 includes a detection error prevention circuit 88 instead of the prevention circuit 72.

The prevention circuit 88 includes the voltage sensor 73 and a switch 87. The switch 87 is interposed between the op-amp 5 and the current mirror circuit 6 and normally closed. When the voltage sensor 73 detects the increase in the potential of the first ground PGND, the switch 87 is opened to stop the current flow from the current mirror circuit 6 to the resistor 10. As a result, the input voltage to the voltage sensor 11 becomes 0 V so that the voltage sensor 11 does not output the overcurrent detection signal IV. Thus, the prevention circuit 88 disables the overcurrent detection signal IV by changing the input state, not the output status, of the voltage sensor 11 when the potential of the first ground PGND is increased due to the open-circuit in the ground wire.

According to the eighth embodiment, the prevention circuit 88 disconnects an electrical connection between the output of the op-amp 5 and the current mirror circuit 6 when the potential of the first ground PGND is increased due to the open-circuit. In such an approach, the prevention circuit 88 can prevent the overcurrent condition from being incorrectly detected not only when the overcurrent condition is analogly detected based on the voltage across the resistor 10 but also when the overcurrent condition is digitally detected by using an A/D converter and a CPU.

Ninth Embodiment

Figure 14:
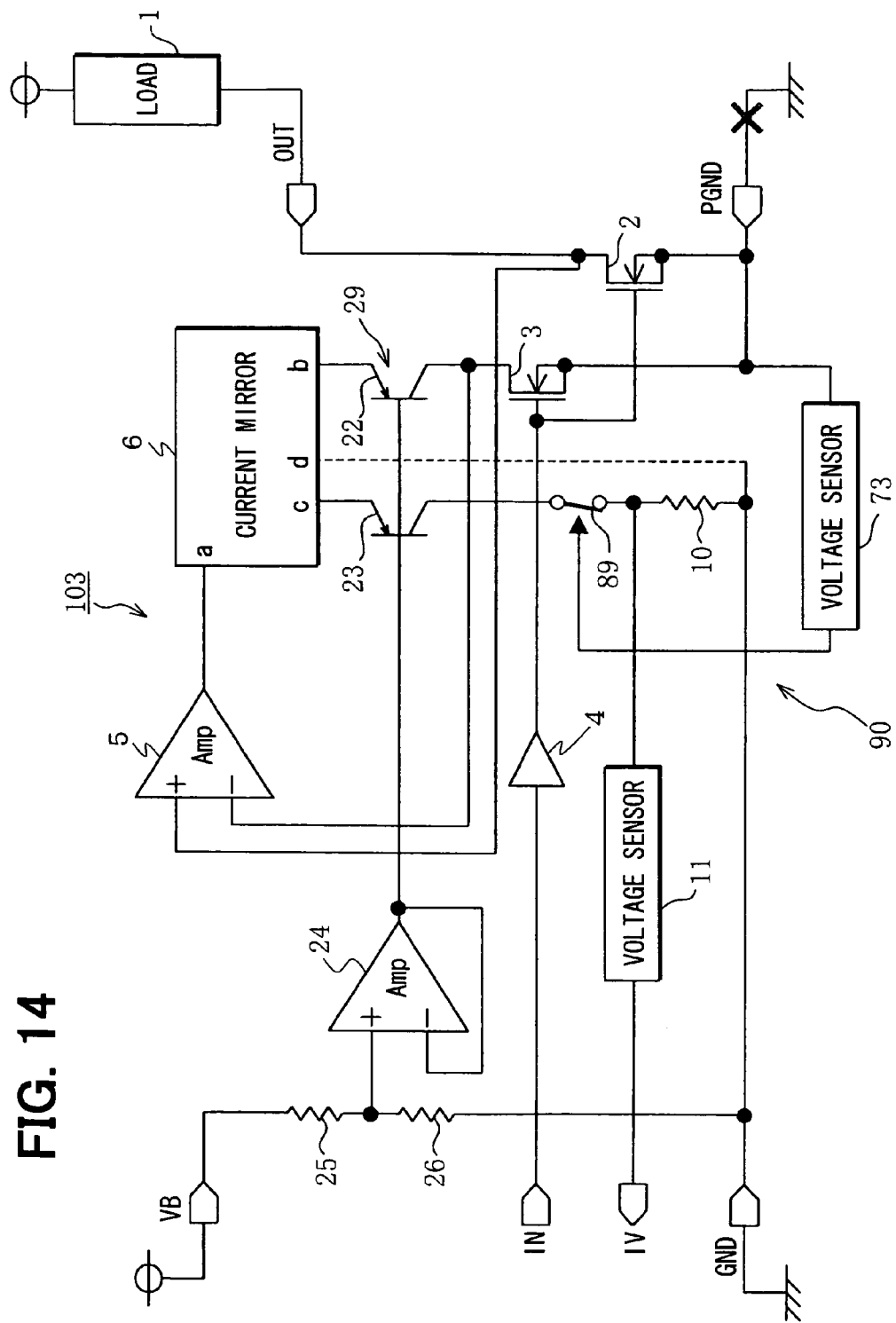
FIG. 14 is a schematic diagram of an overcurrent detection circuit according to a ninth embodiment of the present invention.

An overcurrent detection circuit 103 according to the ninth embodiment is shown in FIG. 14. The overcurrent detection circuit 103 is similar in structure to the overcurrent detection circuit 102 shown in FIG. 13. As can be seen by comparing FIGS. 13 and 14, a difference between the overcurrent detection circuits 102, 103 is that the overcurrent detection circuit 103 includes a detection error prevention circuit 90 instead of the prevention circuit 88.

The prevention circuit 90 includes the voltage sensor 73 and a switch 89. The switch 89 is interposed between the early effect cancel circuit 29 and the resistor 10 and normally closed. When the voltage sensor 73 detects the increase in the potential of the first ground PGND, the switch 89 is opened to stop the current flow from the current mirror circuit 6 to the resistor 10. As a result, the input voltage to the voltage sensor 11 becomes 0 V so that the voltage sensor 11 does not output the overcurrent detection signal IV. Thus, the prevention circuit 90 disables the overcurrent detection signal IV by changing the input state, not the output status, of the voltage sensor 11 when the potential of the first ground PGND is increased due to the open-circuit in the ground wire.

According to the tenth embodiment, the prevention circuit 90 disconnects an electrical connection between the resistor 10 and the current mirror circuit 6 when the potential of the first ground PGND is increased due to the open-circuit. In such an approach, a current flowing through the switch 89 can be reduced compared to a current flowing through the switch 87. Therefore, the switch 89 can be constructed by various kinds of elements.

Tenth Embodiment

Figure 17A:
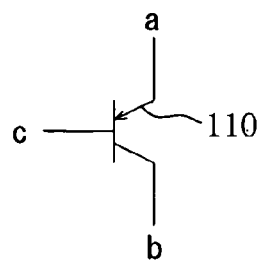
FIGS. 17A-17D are schematic diagrams of a switch in the overcurrent detection circuits of FIGS. 13 and 14.
Figure 17B:
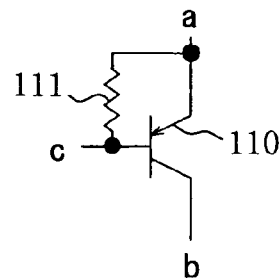
Figure 17C:
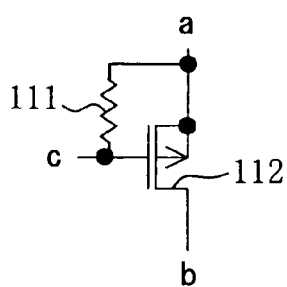
Figure 17D:
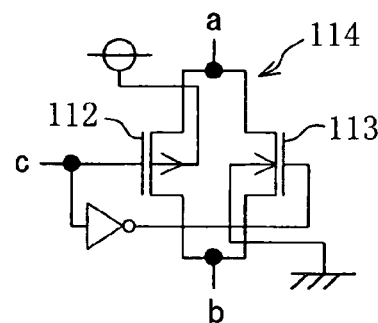

For example, the switches 87, 89 of the overcurrent detection circuits 102, 103 may be constructed as shown in FIGS. 17A-17D. In FIG. 17A, a PNP transistor 110 constructs the switches 87, 89. In FIG. 17B, the PNP transistor 110 and a resistor 111 connected between a base and an emitter of the transistor 110 construct the switches 87, 89. The resistor 111 prevents the switches 87, 89 from being closed or opened by a noise. In FIG. 17C, a P-channel MOS transistor 112 and the resistor 111 connected between a gate and a drain of the MOS transistor 112 construct the switches 87, 89. In FIG. 17D, a CMOS (Complementary MOS) circuit 114 having the MOS transistor 112 and an N-channel MOS transistor 113 construct the switches 87, 89.

However, when the switch 89 of the overcurrent detection circuit 103 is constructed as shown in FIGS. 17A-17D, the following problems may occur. In the case of FIG. 17A, a portion of the current supplied to the resistor 10 by the current mirror circuit 6 is used as a base current to turn on the transistor 110 (i.e., to close the switch 89). The base current used to turn on the transistor 110 reduces the detection accuracy in detecting the overcurrent. In the case of FIG. 17B, since the resistor 111 is connected between the base and the emitter of the transistor 110, the detection accuracy is further reduced than in the case of FIG. 17A. In the case of FIG. 17C, the MOS transistor 112 does not need the base current. However, since the resistor 111 is connected between the source and the gate of the MOS transistor 112, the detection accuracy is reduced. In the case of FIG. 17D, the switch 89 is increased in size because the CMOS circuit 114 generally has low breakdown voltage. Further, since the CMOS circuit 114 needs many elements including an NOT-gate, manufacturing cost of the switch 89 is increased.

Figure 15:
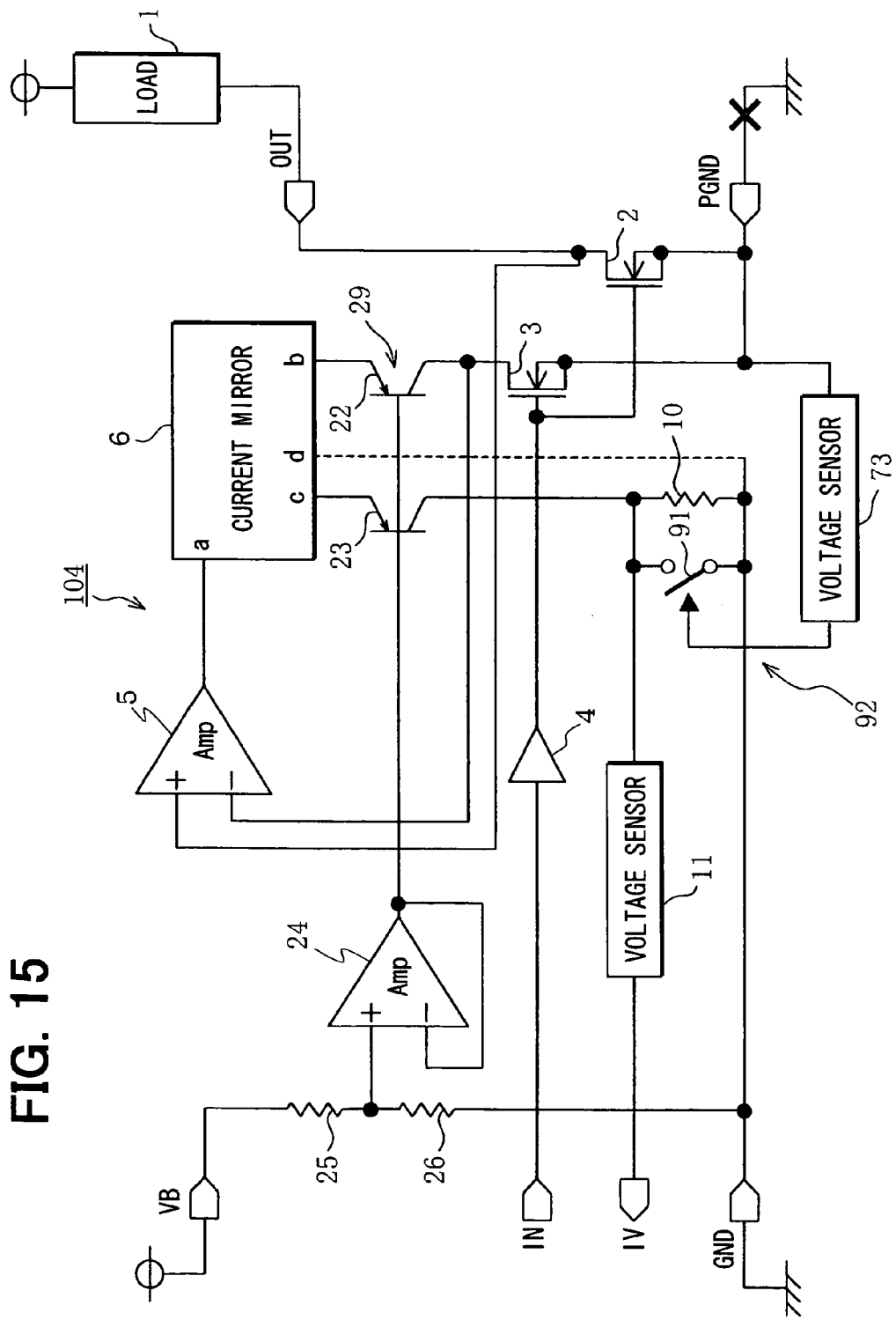
FIG. 15 is a schematic diagram of an overcurrent detection circuit according to a tenth embodiment of the present invention.

An overcurrent detection circuit 104 according to the tenth embodiment is shown in FIG. 15. The overcurrent detection circuit 104 is similar in structure to the overcurrent detection circuit 103 shown in FIG. 14. As can be seen by comparing FIGS. 14 and 15, a difference between the overcurrent detection circuits 103, 104 is that the overcurrent detection circuit 104 includes a detection error prevention circuit 92 instead of the prevention circuit 90.

The prevention circuit 92 includes the voltage sensor 73 and a switch 91. The switch 91 is connected in parallel with resistor 10 and normally opened. When the voltage sensor 73 detects the increase in the potential of the first ground PGND, the switch 91 is closed to short out the resistor 10. As a result, the input voltage to the voltage sensor 11 becomes 0 V so that the voltage sensor 11 does not output the overcurrent detection signal IV. Thus, the prevention circuit 92 disables the overcurrent detection signal IV by changing the input state, not the output status, of the voltage sensor 11 when the potential of the first ground PGND is increased due to the open-circuit in the ground wire.

Figure 16A:
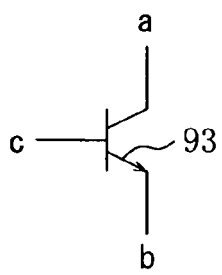
FIGS. 16A-16D are schematic diagrams of a switch in the overcurrent detection circuit of FIG. 15.
Figure 16B:
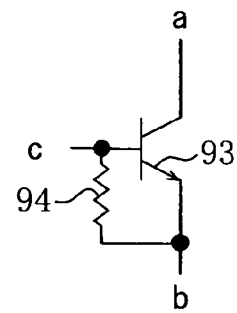
Figure 16C:
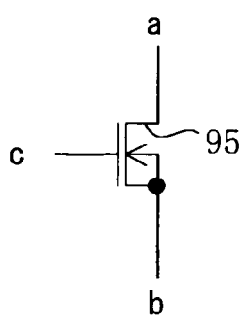
Figure 16D:
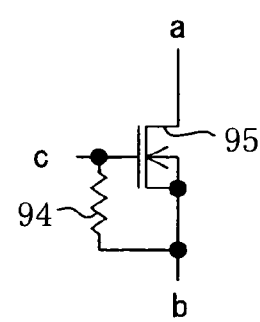

For example, the switch 91 may be constructed as shown in FIGS. 16A-16D. In FIG. 16A, a NPN transistor 93 constructs the switch 91. In FIG. 16B, the transistor 93 and a resistor 94 connected between a base and an emitter of the transistor 93 construct the switch 91. In FIG. 16C, an N-channel MOS transistor 95 constructs the switch 91. In FIG. 16D, the MOS transistor 95 and the resistor 94 connected between a gate and a source of the MOS transistor 95 construct the switch 91.

According to the tenth embodiment, the switch 91 is normally opened so that the reduction in the detection accuracy can be prevented.

Eleventh Embodiment

Figure 18:
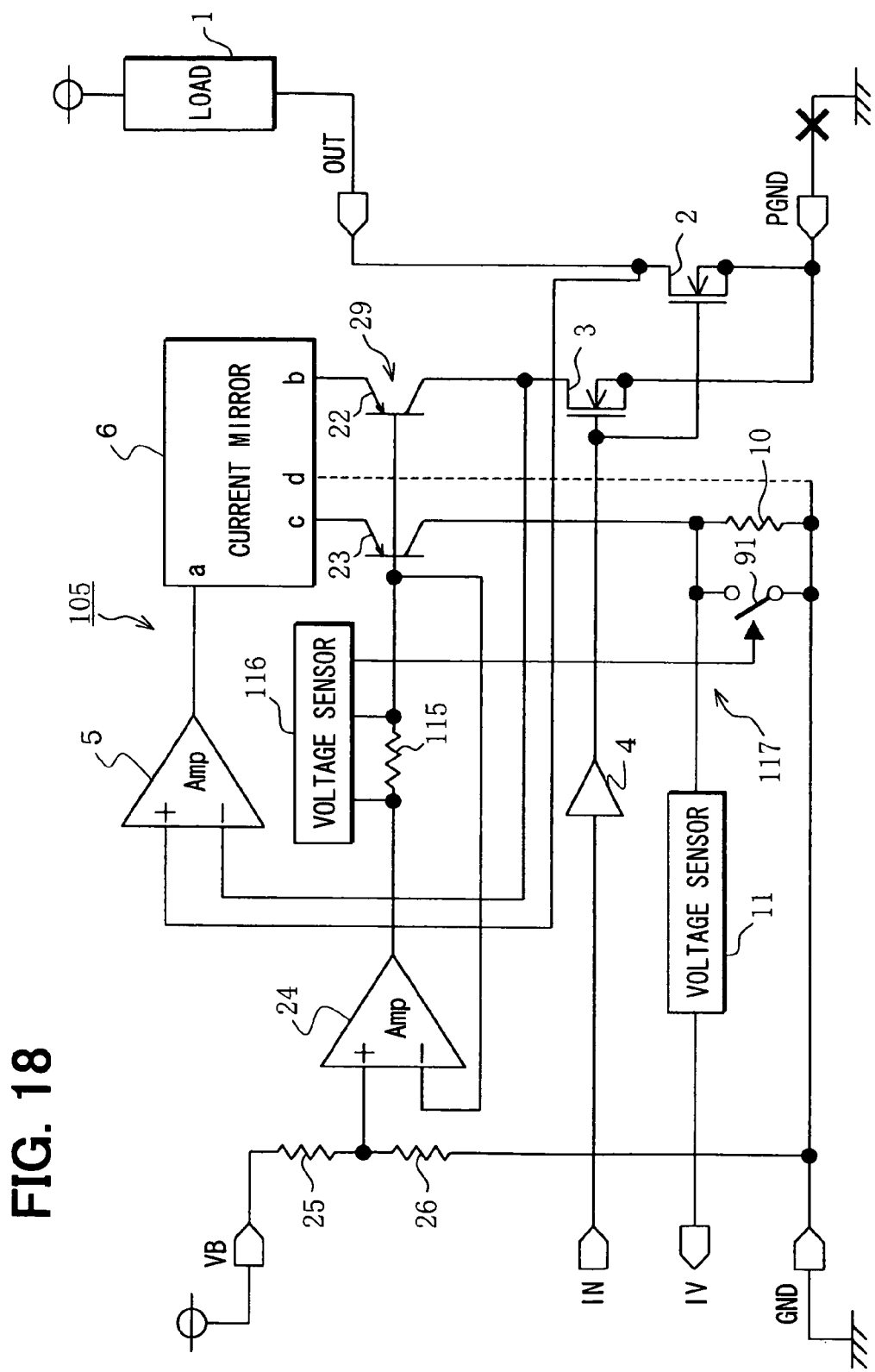
FIG. 18 is a schematic diagram of an overcurrent detection circuit according to an eleventh embodiment of the present invention.

An overcurrent detection circuit 105 according to the eleventh embodiment is shown in FIG. 18. The overcurrent detection circuit 105 is similar in structure to the overcurrent detection circuit 104 shown in FIG. 15. As can be seen by comparing FIGS. 15 and 18, a difference between the overcurrent detection circuits 104, 105 is that the overcurrent detection circuit 105 includes a detection error prevention circuit 117 instead of the prevention circuit 92.

The prevention circuit 117 includes a resistor 115, a voltage sensor 116, and the switch 91 connected in parallel with the resistor 10. The resistor 115 is interposed between the output of the voltage buffer 24 and the early effect cancel circuit 29. The voltage sensor 116 is connected in parallel with the resistor 115 to detect a voltage across the resistor 115. When the voltage across the resistor 115 exceeds a predetermined threshold voltage, the voltage sensor 116 closes the switch 91 to short out the resistor 10. As a result, the input voltage to the voltage sensor 11 becomes 0 V so that the voltage sensor 11 does not output the overcurrent detection signal IV. Thus, the prevention circuit 117 disables the overcurrent detection signal IV.

In the overcurrent detection circuits 100-104 described above, the open-circuit in the ground wire is detected when the potential of the first ground PGND exceeds a predetermined threshold potential value. The value of the threshold potential is discussed below. A potential VPG of the first ground PGND appearing when the open-circuit occurs is given by:

$$VPG=VR+Vcb(T22)+Ron \times IM \quad (10)$$

In the equation (10), VR represents the output voltage of the voltage buffer 24, Ron represents the ON-resistance of the MOS transistor 3, IM represents the current flowing through the MOS transistor 3, and Vcb(T22) represents a collector-base voltage of the transistor 22.

For example, when the voltage VR is 1.5 V, the collector-base voltage Vcb(T22) is 0.7 V, and Ron×IM=0.1 V, the potential VPG increases up to 2.3 V. Therefore, it may be preferable that the value of the threshold potential is set to 2.3 V.

In practice, however, the current IM is variable and the collector-base voltage Vcb(T22) changes with its operating temperature. Therefore, the value of the threshold potential is set to approximately 1.5 V, allowing for margins of error. As a result, the overcurrent detection signal IV may be disabled despite that the open-circuit does not occur. In short, the overcurrent detection circuits 100-104 have a reduced detection range for detecting the overcurrent current.

To overcome the above problem, the overcurrent detection circuit 105 according to this embodiment detects the open-circuit based on the increase in the output current of the voltage buffer 24, not the increase in the potential of the first ground PGND. Specifically, as shown in FIG. 11, when the open-circuit occurs, the current flowing into the output of the voltage buffer 24 is suddenly increased. The voltage across the resistor 115 is increased accordingly. The voltage sensor 116 detects the increase in the voltage across the resistor 115 and closes the switch 91. Thus, the overcurrent detection circuit 105 can have a wide detection range as compared to the overcurrent detection circuits 100-104.

Twelfth Embodiment

Figure 19:
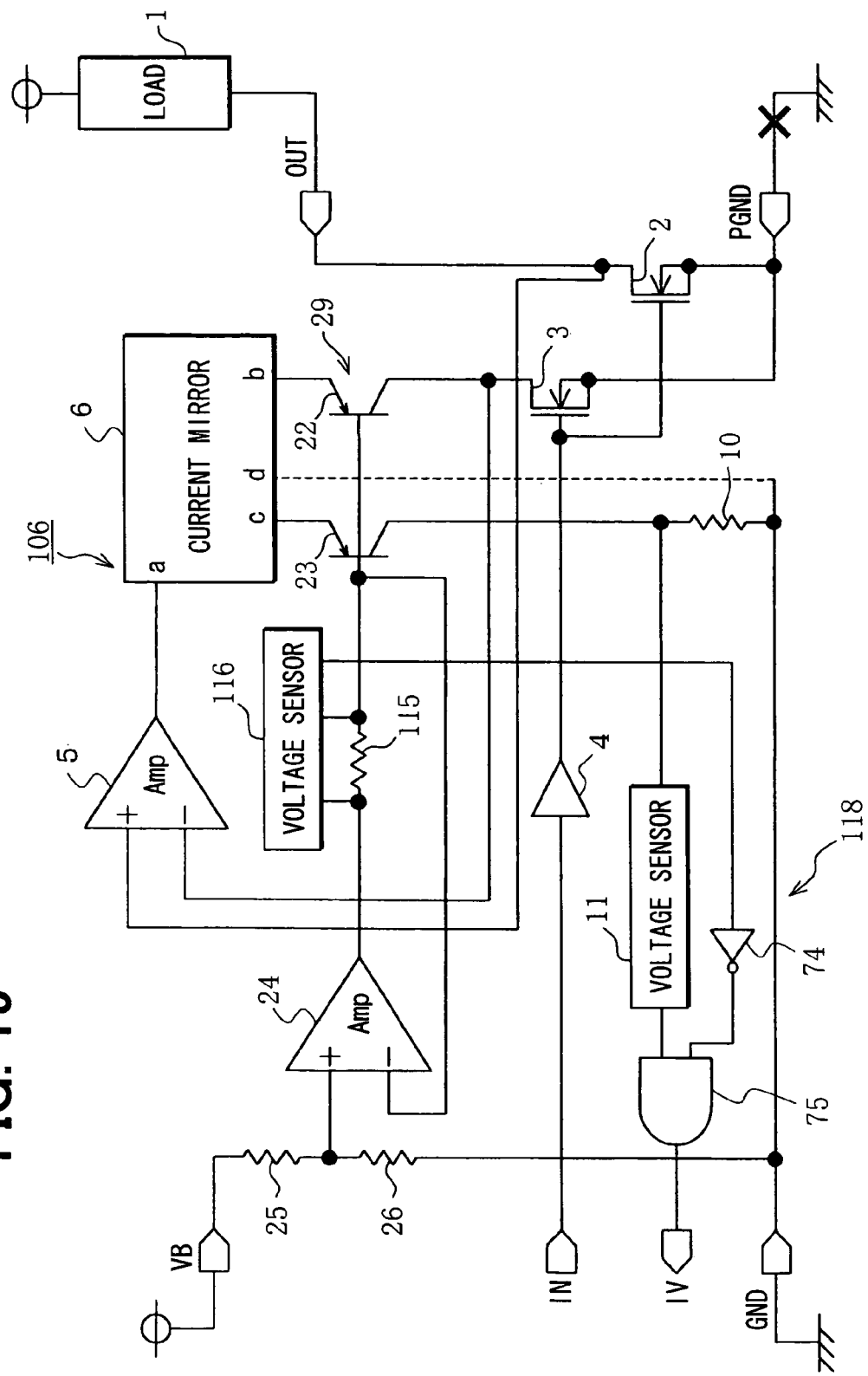
FIG. 19 is a schematic diagram of an overcurrent detection circuit according to a twelfth embodiment of the present invention.

An overcurrent detection circuit 106 according to the eleventh embodiment is shown in FIG. 19. The overcurrent detection circuit 106 is a combination of the overcurrent detection circuits 100, 105. The overcurrent detection circuit 106 includes a detection error prevention circuit 118.

The detection error prevention circuit 118 includes the NOT-gate 74 and the AND-gate 75 of the overcurrent detection circuit 100 and includes the resistor 115 and the voltage sensor 116 of the overcurrent detection circuits 105. The output of the voltage sensor 116 is connected to the input of the NOT-gate 74. Thus, the overcurrent detection circuit 106 can operates in the same manner as the overcurrent detection circuit 105 of the eleventh embodiment.

Thirteenth Embodiment

Figure 20A:
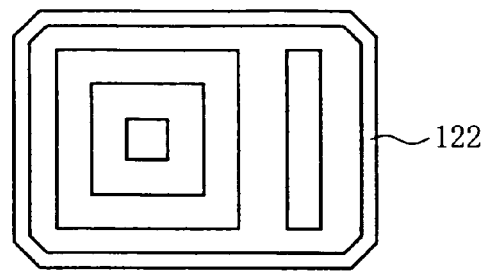
FIG. 20A is a top view of a semiconductor substrate to which an overcurrent detection circuit is formed by trench isolation.
Figure 20B:
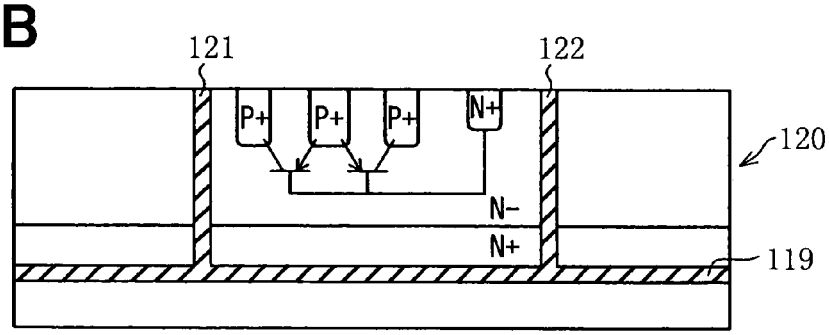
FIG. 20B is a cross-sectional view of FIG. 20A.

For example, the overcurrent detection circuit 21 according to the first embodiment is formed in a chip form on a semiconductor substrate. As shown in FIGS. 20A and 20B, circuit elements of the overcurrent detection circuit 21 are formed on a silicon-on-insulator (SOI) substrate 120 having an oxide film 119. Each of the circuit elements (e.g., PNP transistors) is formed within a region enclosed by a trench 121 filled with an oxide film (i.e., insulation film) 122. Thus, the PNP transistors are isolated from each other by the trench 121.

Figure 21A:
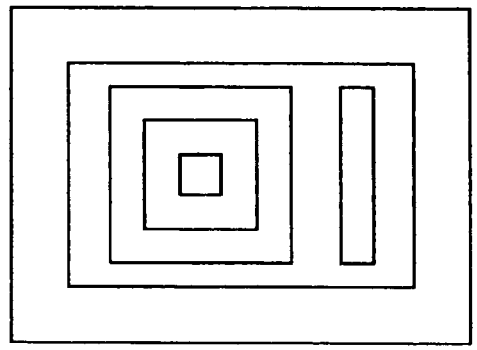
FIG. 21A is a top view of a semiconductor substrate to which an overcurrent detection circuit is formed by pn-junction isolation.
Figure 21B:
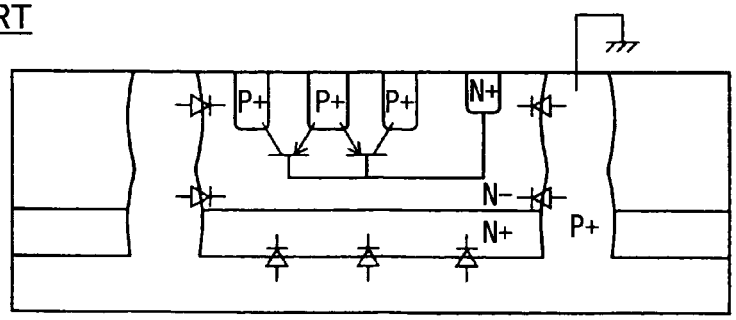
FIG. 21B is a cross-sectional view of FIG. 21A.

As shown in FIGS. 21A and 21B, if the PNP transistors are isolated from each other by P-N junction isolation, a P+ region outside the region where the PNP transistor is formed is connected to the second ground GND (i.e., lowest potential). As shown in FIG. 21A, since parasitic diodes are produced between the P+ region and a N+ region, it is impossible to drive the PNP transistors by a negative potential. In the case of NPN transistors or diodes, the parasitic diodes are also produced. Therefore, it is impossible to drive the circuit elements by a potential lower than minus forward-bias voltage (i.e. −Vf) of the diode. If the potential of the first ground PGND has a variation larger than about plus or minus 1.5 V, the overcurrent detection circuit 21 may incorrectly operate.

By using the trench isolation shown in FIGS. 20A and 20B, electrical potentials required to drive the circuit elements can be suitably provided so that the overcurrent detection circuit 21 can effectively operate.

Modifications

The embodiments described above may be modified in various ways. For example, the MOS transistor 2 can be connected to the load 1 in a high-side drive configuration. The current mirror circuit 6 can be provided on the ground side, not the power supply side. In this case, NPN transistors or N-channel MOS transistors construct the early effect cancel circuit 29. In the op-amp 51 shown in FIG. 6, the collectors of the transistors 30, 31 may be connected to the first ground PGND through a resistor, not directly. The overcurrent detection circuit 105 may be combined with the overcurrent detection circuit 102 or 103. Various types of loads can be connected in series with the MOS transistor 2.

Such changes and modifications are to be understood as being within the scope of the present invention as defined by the appended claims.

What is claimed is:

1. An overcurrent detection circuit for detecting an overcurrent condition in an output transistor connected in series with an electrical load between a power supply and a first ground, the output transistor having a first output terminal connected to the load, a second output terminal connected to the first ground, and an input terminal, the overcurrent detection circuit comprising:

a detection transistor having a first output terminal, a second output terminal connected to the second output terminal of the output transistor, and an input terminal connected to the input terminal of the output transistor so that the output transistor and the detection transistor can be turned on at a time;

an operational amplifier having a non-inverting input terminal connected to the first output terminal of the output transistor, an inverting input terminal connected to the first output terminal of the detection transistor, and an output terminal;

a current mirror circuit including a pair of first and second transistors having first output terminals connected together to the output terminal of operational amplifier, second terminals, and input terminals connected together, the second output terminal of the first transistor being connected to the input terminal of the first transistor and the first output terminal of the detection transistor;

current detection means connected to the second output terminal of the second transistor to detect a current flowing through the second transistor;

an early effect cancel circuit including a pair of third and fourth transistors, the third transistor having a first output terminal connected to the current mirror circuit, a second output terminal connected to the detection transistor, and an input terminal, the fourth transistor having a first output terminal connected to the current mirror circuit, a second output terminal connected to the current detection means, and an input terminal connected to the input terminal of the third transistor; and a fixed voltage source that generates a fixed voltage from the power supply and applies the fixed voltage to the input terminal of each of the third and fourth transistors, wherein an electric potential of the first output terminal of each of the third and fourth transistors is fixed by the application of the fixed voltage to the input terminal of each of the third and fourth transistors, so that the current mirror circuit is allowed to produce a mirror current even when a potential of the first ground is below a predetermined potential.

2. The overcurrent detection circuit according to claim 1, wherein
the overcurrent detection circuit is connected between the power supply and a second ground different from the first ground.

3. The overcurrent detection circuit according to claim 2, wherein
the operational amplifier includes a pair of fifth and sixth transistors for providing an input stage of the operational amplifier, each of the fifth and sixth transistors having an output terminal connected to the first ground directly or through a resistor.

4. The overcurrent detection circuit according to claim 2, further comprising:
an error prevention circuit for detecting an electrical change caused by an open-circuit in a wire connected to the first ground and for disabling an output of the current detection means in response to the electrical change.

5. The overcurrent detection circuit according to claim 4, wherein
the error prevention circuit disables the output of the current detection means when an electrical potential of the first ground exceeds a predetermined potential value.

6. The overcurrent detection circuit according to claim 4, wherein the error prevention circuit disables the output of the current detection means when an output current of the fixed voltage source exceeds a predetermined current value.

7. The overcurrent detection circuit according to claim 4, wherein
the error prevention circuit disconnects an electrical connection between the output terminal of the operational amplifier and the current mirror circuit in response to the electrical change.

8. The overcurrent detection circuit according to claim 4, wherein
the error prevention circuit disconnects an electrical connection between the current detection means and the current mirror circuit in response to the electrical change.

9. The overcurrent detection circuit according to claim 4, wherein
the current detection means includes a resistor and a voltage sensor for detecting a voltage produced across the resistor by the current flowing through the second transistor, and
the error prevention circuit shorts out the resistor in response to the electrical change.

10. The overcurrent detection circuit according to claim 1, wherein
the overcurrent detection circuit is provided on a SOI substrate having a trench portion filled with an electrical insulating material, and
circuit elements constructing the overcurrent detection circuit are isolated from each other by the trench portion.

11. The overcurrent detection circuit according to claim 2, wherein the current mirror circuit is allowed to produce the mirror current even when the potential of the first ground is less than a potential of the second ground by a predetermined value.

12. The overcurrent detection circuit according to claim 11, wherein the predetermined value is equal to or greater than 1.5 volts.

* * * * *